(12) United States Patent
Schillaci et al.

(10) Patent No.: US 9,508,846 B2
(45) Date of Patent: Nov. 29, 2016

(54) VERTICAL MOS SEMICONDUCTOR DEVICE FOR HIGH-FREQUENCY APPLICATIONS, AND RELATED MANUFACTURING PROCESS

(71) Applicant: STMicroelectronics S.r.l., Agrate Brianza (IT)

(72) Inventors: Antonino Schillaci, Messina (IT);
Alfonso Patti, Tremestieri Etneo (IT);
Paola Maria Ponzio, Gela (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 42 days.

(21) Appl. No.: 14/662,652

(22) Filed: Mar. 19, 2015

(65) Prior Publication Data

US 2015/0303300 A1    Oct. 22, 2015

(30) Foreign Application Priority Data

Apr. 18, 2014   (IT) .............. TO2014A0334

(51) Int. Cl.
| | |
|---|---|
| H01L 29/66 | (2006.01) |
| H01L 29/78 | (2006.01) |
| H01L 29/40 | (2006.01) |
| H01L 21/8234 | (2006.01) |
| H01L 29/423 | (2006.01) |
| H01L 29/06 | (2006.01) |

(52) U.S. Cl.
CPC ... *H01L 29/7827* (2013.01); *H01L 21/823487* (2013.01); *H01L 29/0688* (2013.01); *H01L 29/402* (2013.01); *H01L 29/4232* (2013.01); *H01L 29/66712* (2013.01); *H01L 29/7802* (2013.01); *H01L 29/7831* (2013.01)

(58) Field of Classification Search
USPC ........ 257/328, 329, 340, 341; 438/268, 301, 438/527
See application file for complete search history.

(56) References Cited

U.S. PATENT DOCUMENTS

| | | | |
|---|---|---|---|
| 4,455,565 A | 6/1984 | Goodman et al. | |
| 6,087,697 A | 7/2000 | Patel | |

(Continued)

FOREIGN PATENT DOCUMENTS

WO    91/11826 A1    8/1991

OTHER PUBLICATIONS

Gogoi, B. et al., "New Vertical Silicon Microwave Power Transistor Structure and Package With Inherent Thermal Self Protection," IEEE MTT-S International Microwave Symposium Digest, Boston, MA, pp. 569-572, Jun. 7-12, 2009.

*Primary Examiner* — Errol Fernandes
(74) *Attorney, Agent, or Firm* — Seed IP Law Group LLP

(57) ABSTRACT

A MOS semiconductor device of a vertical type has: a functional layer, having a first type of conductivity; gate structures, which are formed above the functional layer and have a region of dielectric material and an electrode region; body wells, which have a second type of conductivity, are formed within the functional layer, and are separated by a surface separation region; source regions, which have the first type of conductivity and are formed within the body wells. Each gate structure extends laterally above just one respective body well and does not overlap the surface separation region of the functional layer. The device may further have: at least one shield structure, arranged between adjacent gate structures above the surface separation region; and/or at least one doped control region, having the second type of conductivity, arranged within the surface separation region, which are both set at the source potential.

21 Claims, 19 Drawing Sheets

(56) References Cited

U.S. PATENT DOCUMENTS

| | | |
|---|---|---|
| 6,207,508 B1 | 3/2001 | Patel |
| 6,448,160 B1 | 9/2002 | Chang et al. |
| 6,750,512 B2 | 6/2004 | Schillaci et al. |
| 6,919,252 B2 | 7/2005 | Schillaci et al. |
| 7,397,084 B2 | 7/2008 | Loechelt et al. |
| 2005/0221567 A1 | 10/2005 | Schillaci et al. |
| 2006/0249785 A1 | 11/2006 | Bhalla et al. |
| 2013/0320430 A1 | 12/2013 | Ng et al. |

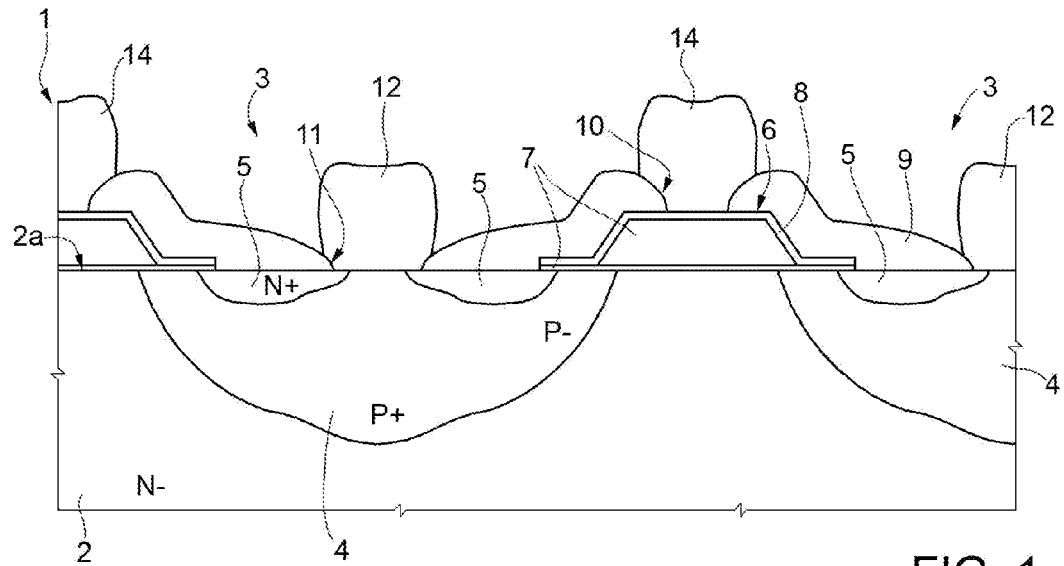
FIG. 1
(Prior Art)
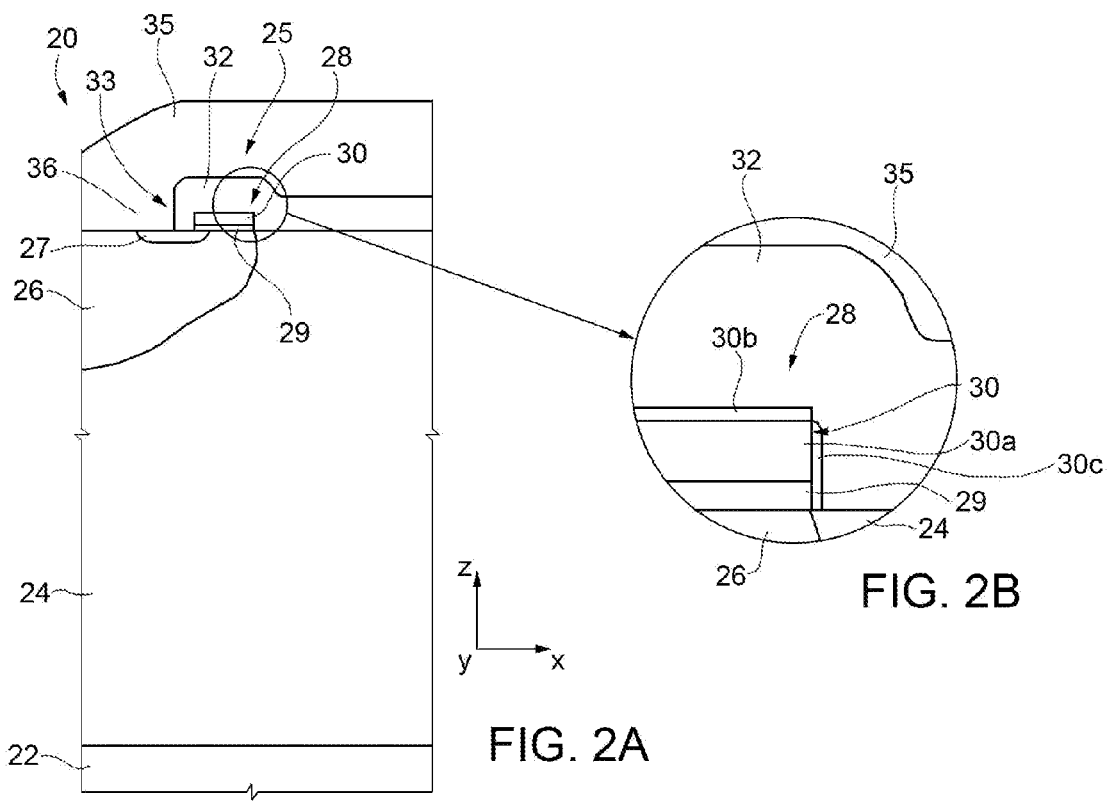
FIG. 2A
FIG. 2B

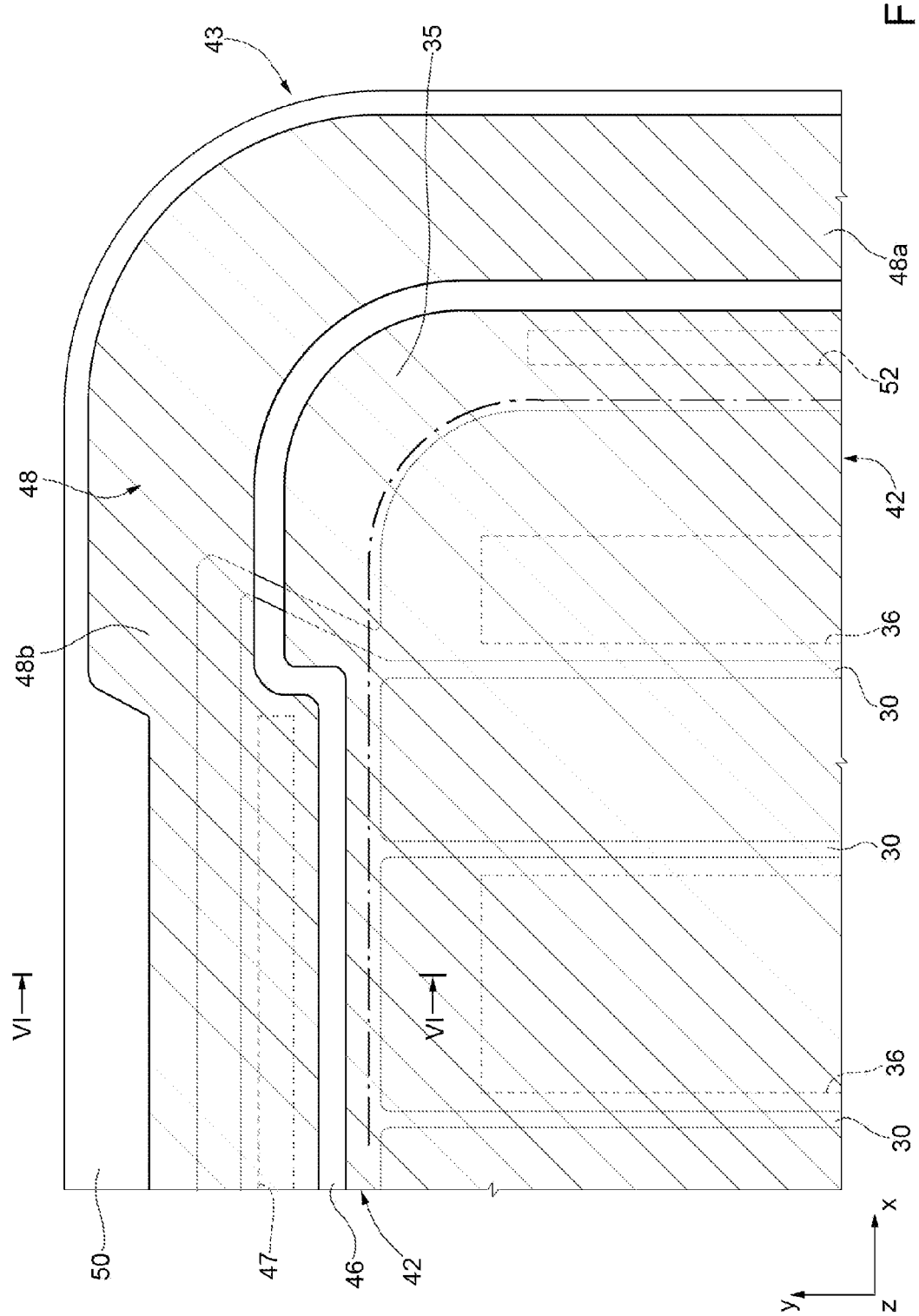

VERTICAL MOS SEMICONDUCTOR DEVICE FOR HIGH-FREQUENCY APPLICATIONS, AND RELATED MANUFACTURING PROCESS

BACKGROUND

1. Technical Field

The present disclosure relates to a MOS (Metal Oxide Semiconductor) semiconductor device of a vertical type, in particular for applications at high operating frequency (for example at radiofrequency, RF), and to a related manufacturing process.

2. Description of the Related Art

FIG. 1 shows a basic, or elementary, structure of a vertical MOS device, in particular an N-channel vertical DMOS (VDMOS—Vertical Double-Diffused Metal Oxide Semiconductor) device, for high-frequency, for example RF, applications, which is designated by 1 and comprises: a substrate of semiconductor material (for example, silicon) that is heavily doped (for example of an $N^+$ type), here not illustrated, and an epitaxial layer 2, which is also of semiconductor material and has the same type of conductivity as the substrate and overlies the substrate. The substrate has the function of drain for the device 1, and the epitaxial layer 2 constitutes a surface extension thereof.

Cells 3 of the device 1 are formed within an active area of the epitaxial layer 2, each comprising a body well 4 having a conductivity opposite to that of the epitaxial layer 2 (in the example, a conductivity of a P type), and a source region 5, within the body well 4, having the same type of conductivity as the substrate 2 (in the example, a conductivity of an $N^+$ type). Each body well 4 is shared by two contiguous cells 3 of the DMOS device 1, and it contains two source regions 5, one for each cell 3, which are arranged between them at a certain lateral distance (in a direction transverse to the vertical direction).

The surface portion of the epitaxial layer 2, arranged at a main top surface 2a thereof, interposed between adjacent body wells 4, is commonly referred to as "intercell region" or "drift region".

The device 1 further comprises: a gate structure 6, constituted by a first region of dielectric material 7, which is formed above the entire drift region and partially overlies the body wells 4; a gate electrode 8, which is provided on the first region of dielectric material 7, and thus on the drift region, and extends laterally over the body wells 4 and the source regions 5 of two adjacent cells 3; and a second region of dielectric material 9, for example a field-oxide region, overlying the gate electrode 8, except for a central portion thereof, in which a first contact opening 10 is provided.

The first region of dielectric material 7 includes a central portion, which is thick, including field oxide extending over the drift region, and lateral portions, of thin gate oxide, arranged on edge portions of the body wells 4 and on the source regions 5.

The gate electrode 8 has a trapezoidal cross-section, in a way conformable to the underlying region of dielectric material 7, on which the same gate electrode 8 is obtained with deposition techniques.

Through the second region of dielectric material 9 second contact openings 11 are further defined, designed to expose surface portions of the source regions 5 and of the corresponding body well 4 in such a way as to enable electrical connection thereof from outside.

In particular, source metallizations 12, which have an elongated, so-called "finger-shaped", conformation, are provided on the body wells 4 for contacting the same body wells 4 and the source regions 5. A drain metallization (here not shown) contacts the substrate from the back. In addition, gate metallizations 14, which also have an elongated finger-shaped conformation, comb-fingered to the source metallizations 12, are provided within the first contact openings 10 for contacting the gate electrodes 8.

The channel of each cell 3 is formed in the portion of the corresponding body well 4 arranged directly underneath the gate electrode 8, and is delimited by the junction between the source region 5 and the body well 4 on one side, and by the junction between the body well 4 itself and the drift region of the epitaxial layer 2, on the other side.

The gate electrode 8 is capacitively coupled to the channel for modulating the type of conductivity thereof. In particular, by applying a suitable voltage to the gate electrode 8 it is possible to cause channel inversion and thus create a conductive path for the electrons between the source region 5 (first current-conduction region of the device) and the substrate (second current-conduction region of the device), through the channel and the drift region.

In a way not illustrated, conductive tracks or paths (buses) and contact pads are further provided in a non-active area of the epitaxial layer 2 of the device 1 (i.e., an area not dedicated to formation of the cells 3 and to control of the electric current), for enabling input/output electrical connection from/to the outside world via the source and gate metallizations 12, 14.

Vertical MOS devices that include the above basic structure are, for example, described in U.S. Pat. No. 6,750,512 and U.S. Pat. No. 6,919,252, which were assigned to the present Applicant.

It is known that the technological advancements, for example of radiofrequency systems for applications in the field of telecommunications, satellite communications, radio diffusion, or in the space field (ISM—Interstellar Medium), would benefit from MOS devices that work at high frequencies, for example with values in the 150 to 250 MHz range or higher, at the same time guaranteeing adequate electrical performance, for example in terms of gain and immunity to disturbance.

The present Applicant has found that MOS devices of a known type have certain limitations of a structural type that do not allow adequate performance to be achieved at high operating frequencies. These limitations are linked in particular to the sizing of the channel, with an obvious impact on the parasitic capacitances intrinsically present in the structure.

BRIEF SUMMARY

One embodiment of the present disclosure is an improved structure for a vertical MOS semiconductor device for applications at high operating frequency.

According to the present disclosure, a vertical MOS semiconductor device and a related manufacturing process are consequently provided.

One embodiment of the present disclosure is a MOS semiconductor device of a vertical type that includes a functional layer, first and second gate structures positioned above said functional layer, first and second body wells formed within said functional layer, and first and second source regions formed respectively within said first and second body wells. The functional layer has a first type of conductivity and is configured to provide a first current-conduction region of said device. Each gate structure includes a dielectric region and an electrode region. The body wells have a second type of conductivity and are separated from one another by a surface separation region of said functional layer. The first and second source regions are positioned laterally and partially underneath the first and second gate structures, respectively, and are designed to provide a second current-conduction region of said device. The first and second gate structures extend directly above the first and second body wells, respectively and do not overlap the surface separation region of said functional layer arranged between the body wells.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIG. 1 shows a cross-section of a portion of a known semiconductor device of a VDMOS type;

FIG. 2a shows a cross-section of a portion of a vertical MOS semiconductor device according to one embodiment of the present disclosure;

FIG. 2b shows an enlarged detail of a part of the device of FIG. 2a;

FIGS. 3a-3c show plots regarding electrical quantities associated with the device of FIG. 2a;

FIGS. 5a-5e show schematic top plan views of portions of the layout of the vertical MOS semiconductor device of FIGS. 4a and 4b;

DETAILED DESCRIPTION

Figure 3A:
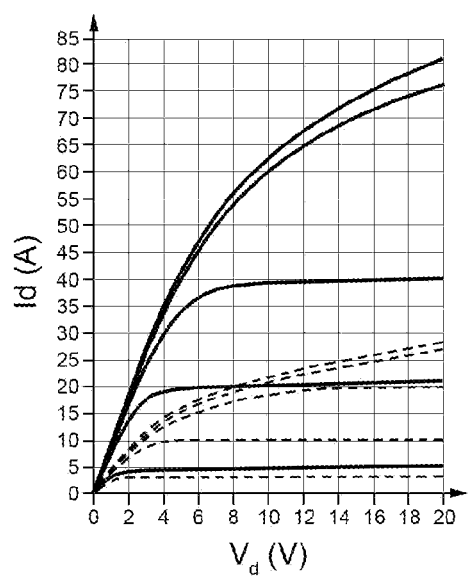

With reference first to FIGS. 2a and 2b, a vertical MOS semiconductor device is now disclosed, in particular of an N-channel VDMOS type suitable for applications at high operating frequency (for example, at radiofrequency), according to an aspect of the present solution and designated as a whole by 20.

MOS device 20 is provided in a die including semiconductor material, for example silicon, and comprises a substrate (or structural layer) 22, which is heavily doped (for example, with a doping of an $N^+$ or $N^{++}$ type), and a functional layer 24, arranged on the substrate 22 and having the same type of conductivity as the same substrate 22 (for example, of an N-type). The functional layer 24 is, for example, grown with an epitaxial technique on the substrate 22, and provides, together with the substrate 22, the drain of the MOS device 20 (i.e., a first current-conduction region of the device).

A plurality of functional units 25 (the arrangement, or layout, of which will be described in greater detail hereinafter) are formed within an active area of the functional layer 24; functional units 25 have in general a strip-like extension in a longitudinal direction y (i.e., in a direction orthogonal to the transverse direction x of the cross-section of FIG. 2a and to a vertical direction z).

Each functional unit 25 comprises a body well 26 having a conductivity opposite to that of the functional layer 24 (in the example, a conductivity of a P type), and a source region 27, within the body well 26, having the same type of conductivity as the substrate 22 (in the example, a conductivity of an $N^+$ type), and defining a second current-conduction region of the device. Each body well 26 is shared by two contiguous functional units 25 of the MOS device 20, and contains two source regions 27, arranged at a certain distance from one another in the transverse direction x.

According to one embodiment of the present disclosure, each functional unit 25 further comprises a gate structure 28, which has a transverse extension substantially limited to just the channel region of a body well 26 of the MOS device 20 (defined in a way similar to what has been described previously) and to a partial overlapping with the source region 27 of the same functional unit 25, without however overlapping the drift region, i.e., the portion of the functional layer 24 arranged between two adjacent body wells 26.

In greater detail, the gate structure 28 has a strip-like conformation in the longitudinal direction y, and comprises a gate dielectric region 29, for example including silicon oxide ($SiO_2$), and a gate-electrode region 30, overlying the gate dielectric region 29 and having substantially the same transverse dimensions as the gate dielectric region 29. The gate-electrode region 30 has a first side wall vertically aligned to the boundary of the underlying body well 26 with the portion of the functional layer 24 arranged between two adjacent body wells 26, and a second side wall, opposite to the first, vertically overlying the source region 27.

A dielectric layer 32, of a conformable type, is provided on the gate structures 28 and the functional layer 24, and source contact openings 33 are defined through the dielectric layer 32, in areas corresponding to the body wells 26, partially exposing the source regions 27.

MOS device 20 further comprises a source-metallization layer 35, of a conformable type, for example including aluminum, extending above the dielectric layer 32 in the entire active area and in particular within the source contact openings 33 for contacting the source regions 27 and the body wells 26 via source contact regions 36.

The gate-electrode region 30 is treated, with known techniques, using a silicide process, for example with cobalt silicide, and consequently comprises (see in particular FIG. 3b) a polysilicon region 30a, formed on which is a silicide region 30b in order to improve the contact and electrical conductivity characteristics. A thin insulation region 30c, resulting from oxidation during the manufacturing process, is present at the sides of the gate structure 28.

The structure described for the functional units of the MOS device 20 have some advantages, amongst which: an improvement of the performance in frequency, thanks, amongst other things, to the use of the silicide process for obtaining the gate-electrode regions 30; the possibility of performing bonding of the source electrical wires directly in the active area (as will be described in detail hereinafter), with a considerable reduction of the parasitic capacitances, which normally may be put down to the presence of the conventional source pads, and with a saving of area that is normally dedicated, in the non-active area, to formation of the conventional source pads.

The channel width may be reduced as compared to traditional solutions, for example below the micron level, which advantageously entails an increase in the transconductance Gfs, a reduction in the static input capacitance Ciss, and a reduction in the channel component of the resistance Rdson of the MOS device 20.

Furthermore, the structure described enables an increase of the transverse distance between adjacent body wells 26, which advantageously entails an increase of the current capacity (and a decrease of the so-called J-FET effect). In particular, this increase of the transverse distance is also allowed by the fact that the gate-electrode regions 30 have a limited transverse extension so that polysilicon is not present above the portion of the functional layer 24 arranged between two adjacent body wells 26 (thus not generating undesirable capacitive components).

The structure described may, however, entail a possible adverse effect on the efficiency of the active area for the purposes of the breakdown voltage (said adverse effect may in any case be solved as described in detail hereinafter).

In general, the improvement of the characteristics linked to the resistance Rdson and to the current capacity Id per unit area makes it possible to obtain, with a smaller number of functional units 25, a DC performance comparable to, if not higher than, that of traditional devices, with a considerable reduction in the parasitic capacitances.

Figure 3B:
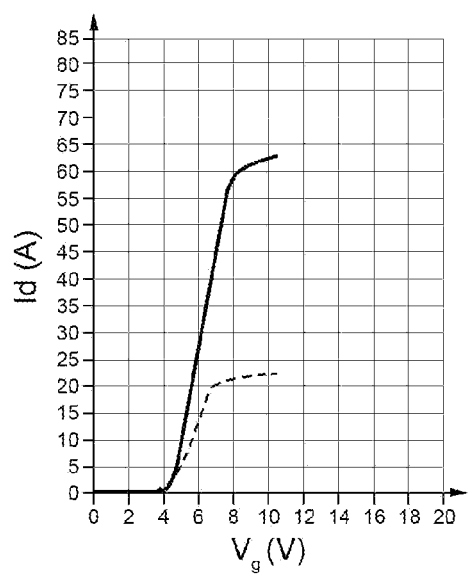
Figure 3C:
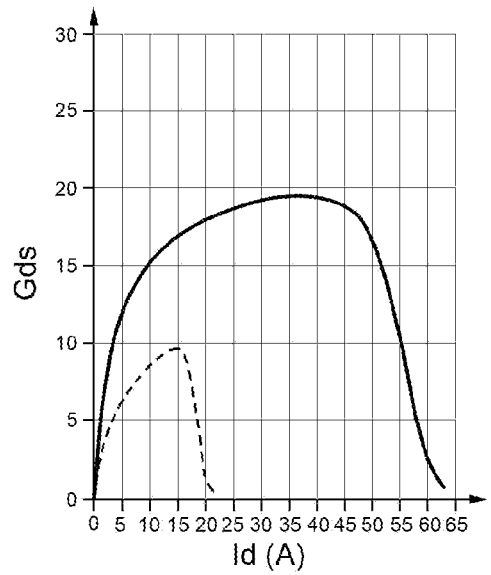

These advantageous characteristics have been tested by the present Applicant, by experimental tests and numeric simulation, some comparative results of which appear in FIGS. 3a, 3b, 3c as compared to a conventional DMOS structure, given the same channel perimeter, as regards: the output characteristic (drain current Id vs. drain voltage Vd); transcharacteristic (drain current Id vs. gate voltage Vg); and transconductance Gds (as a function of the drain current Id). In the plots, the plots regarding the new structure are represented with a solid line, and the plots regarding the conventional structure are represented with a dashed line.

A further aspect of the present solution envisages a general reduction, in the MOS device 20, of the parasitic capacitances linked to the layout, in particular linked to the contribution of the gate pads and/or buses in the non-active area and of the edge-termination region of the active area.

Figure 4A:
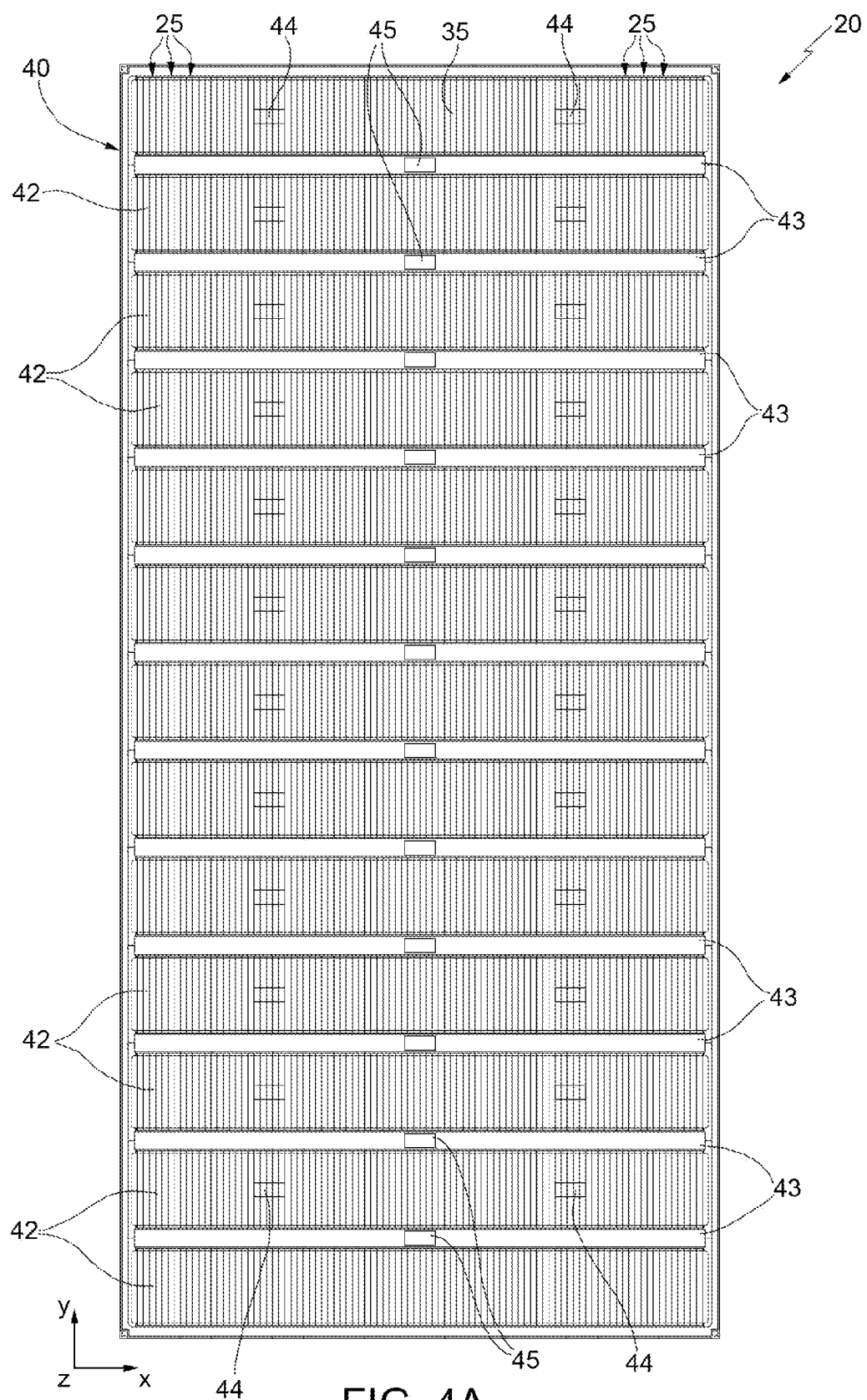
FIGS. 4a-4b show general simplified top plan views of the layout of the vertical MOS semiconductor device, according to one embodiment of the present disclosure.
Figure 4B:
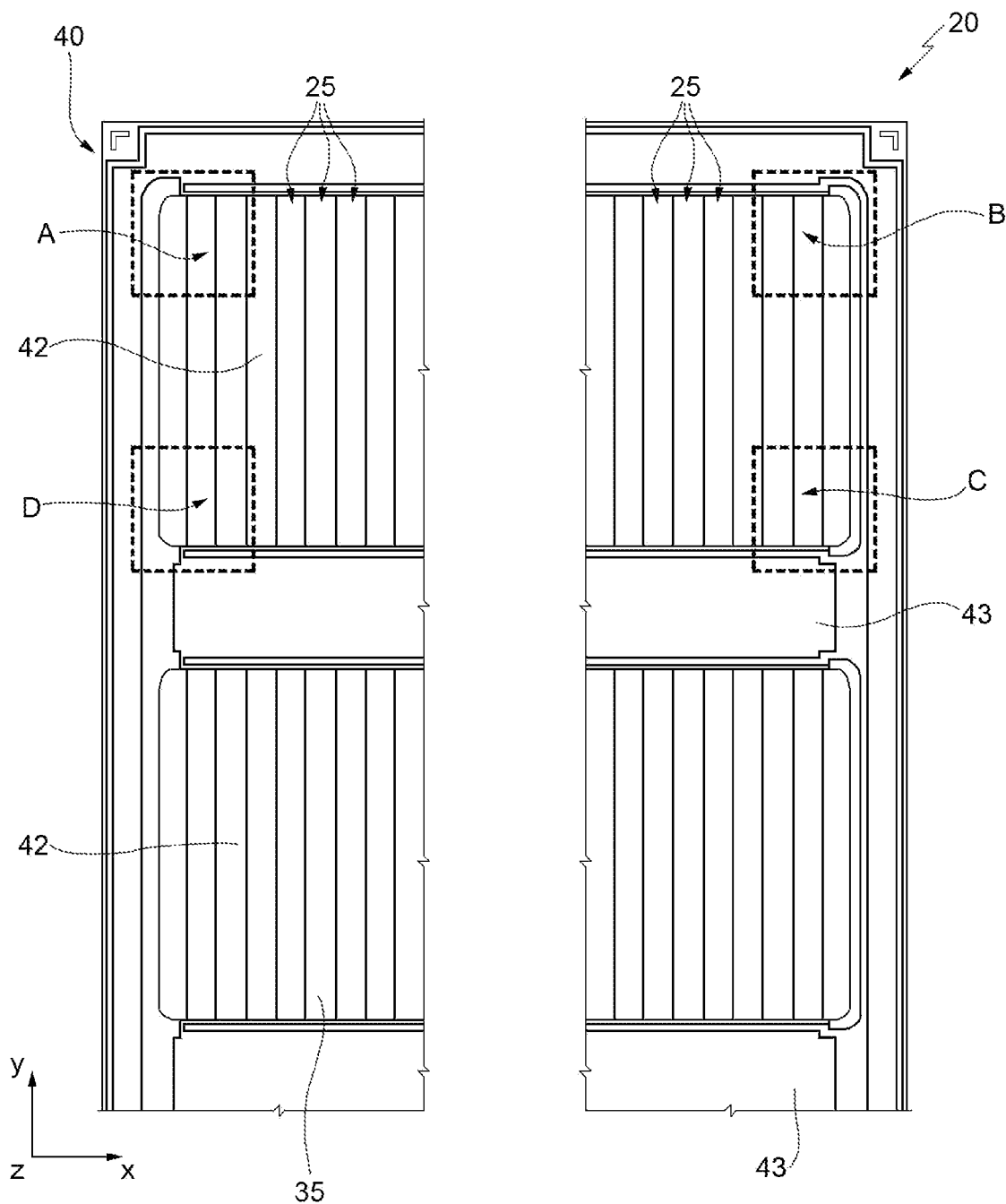

With reference first to FIGS. 4a and 4b, the general layout of the MOS device 20 envisages definition in the die, here designated by 40, of a plurality of active areas, here designated by 42, each of which includes a plurality of functional units 25 (here illustrated schematically and simplified), which have a strip-like extension in the longitudinal direction y. Active areas 42 are separated in the same longitudinal direction y by non-active areas 43.

Source pads 44, for example two in number, are provided in each active area 42, and directly contact the source-metallization layer 35 and enable electrical connection thereof with the outside world. Furthermore, a gate pad 45 is provided at each non-active area 43 arranged between two adjacent active areas 42, in electrical contact, through a gate bus (illustrated hereinafter), with the gate-electrode regions 30 of the gate structures 28 of the functional units 25 arranged in the same two active areas 42.

Figure 5A:
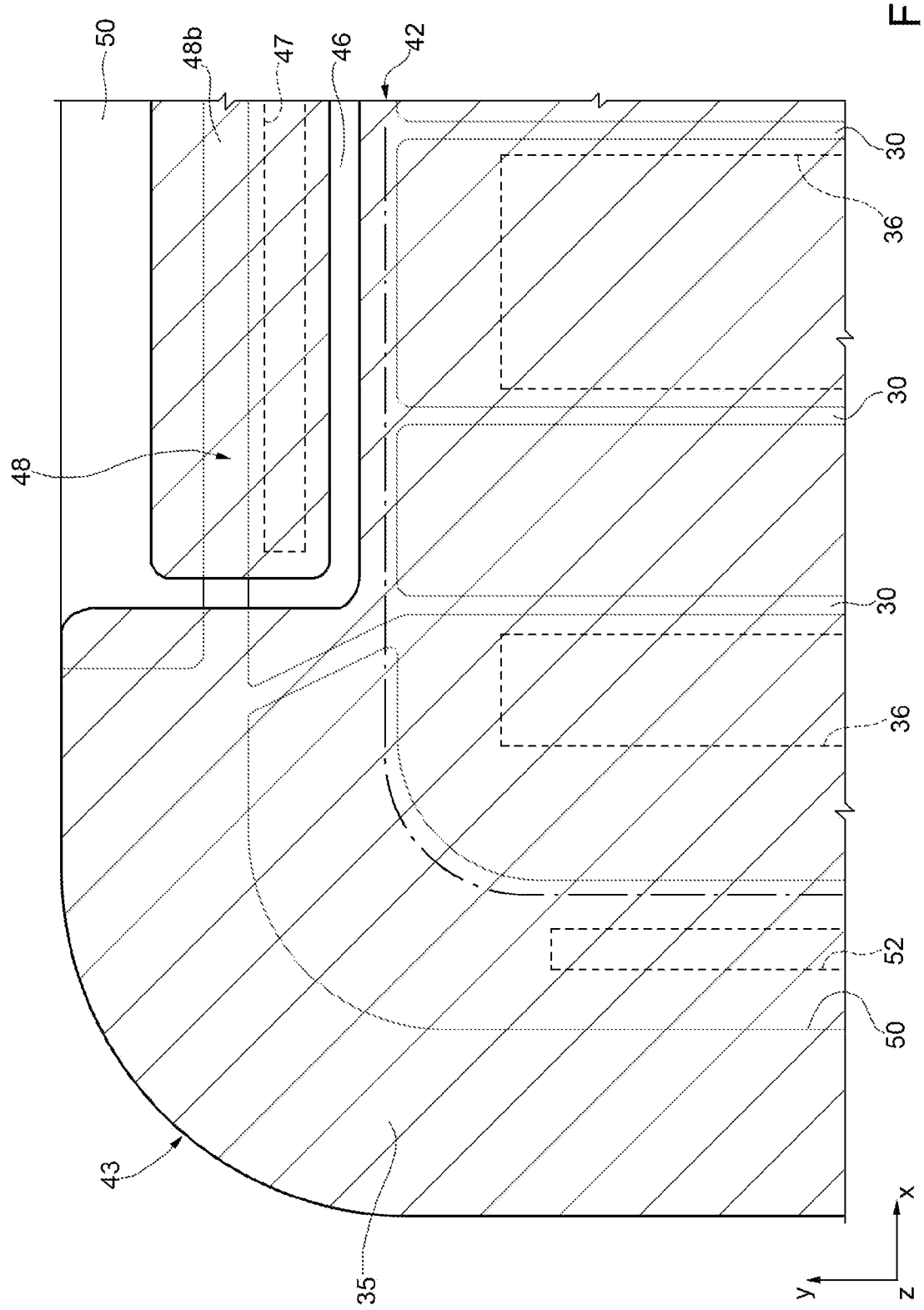
Figure 5C:
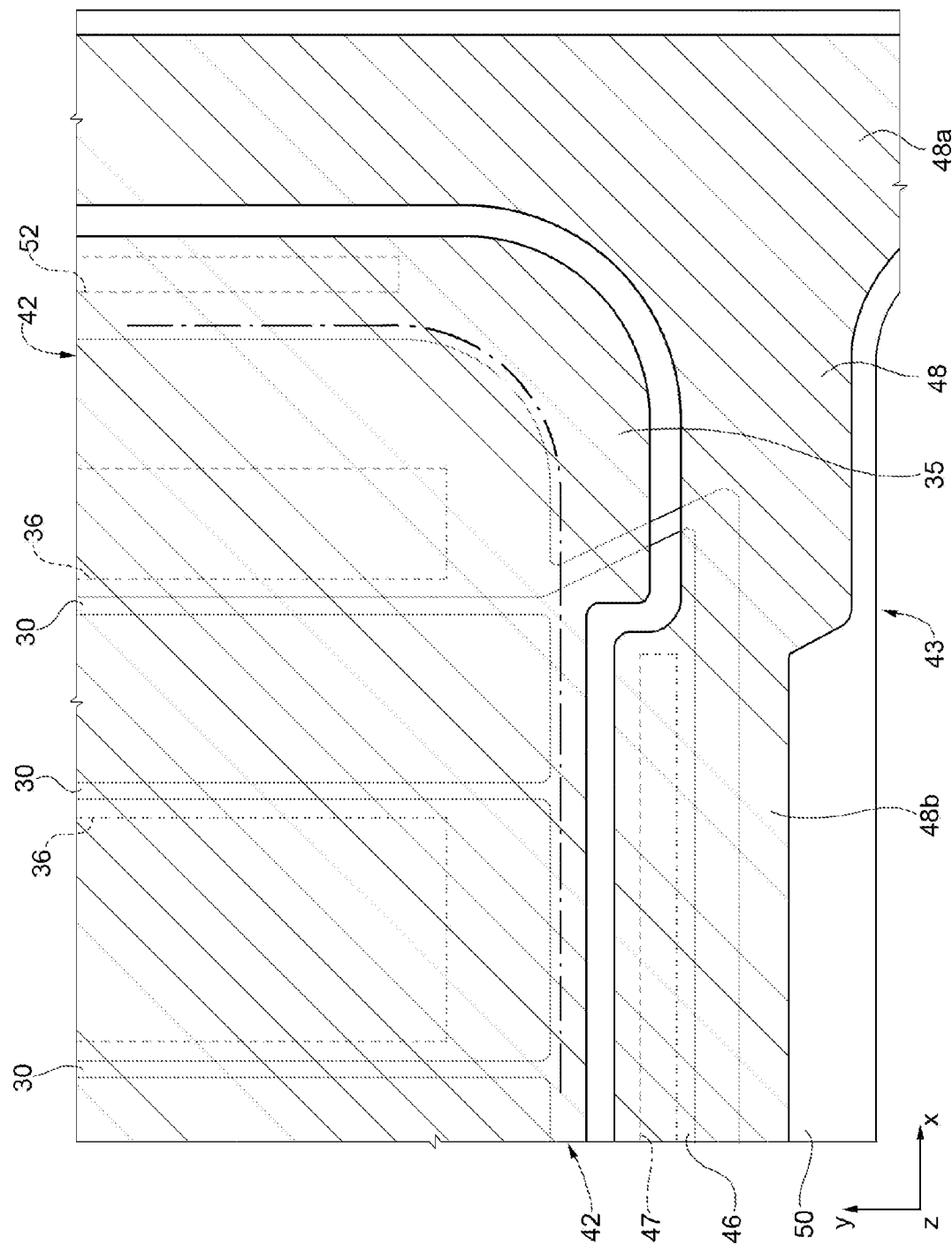
Figure 5D:
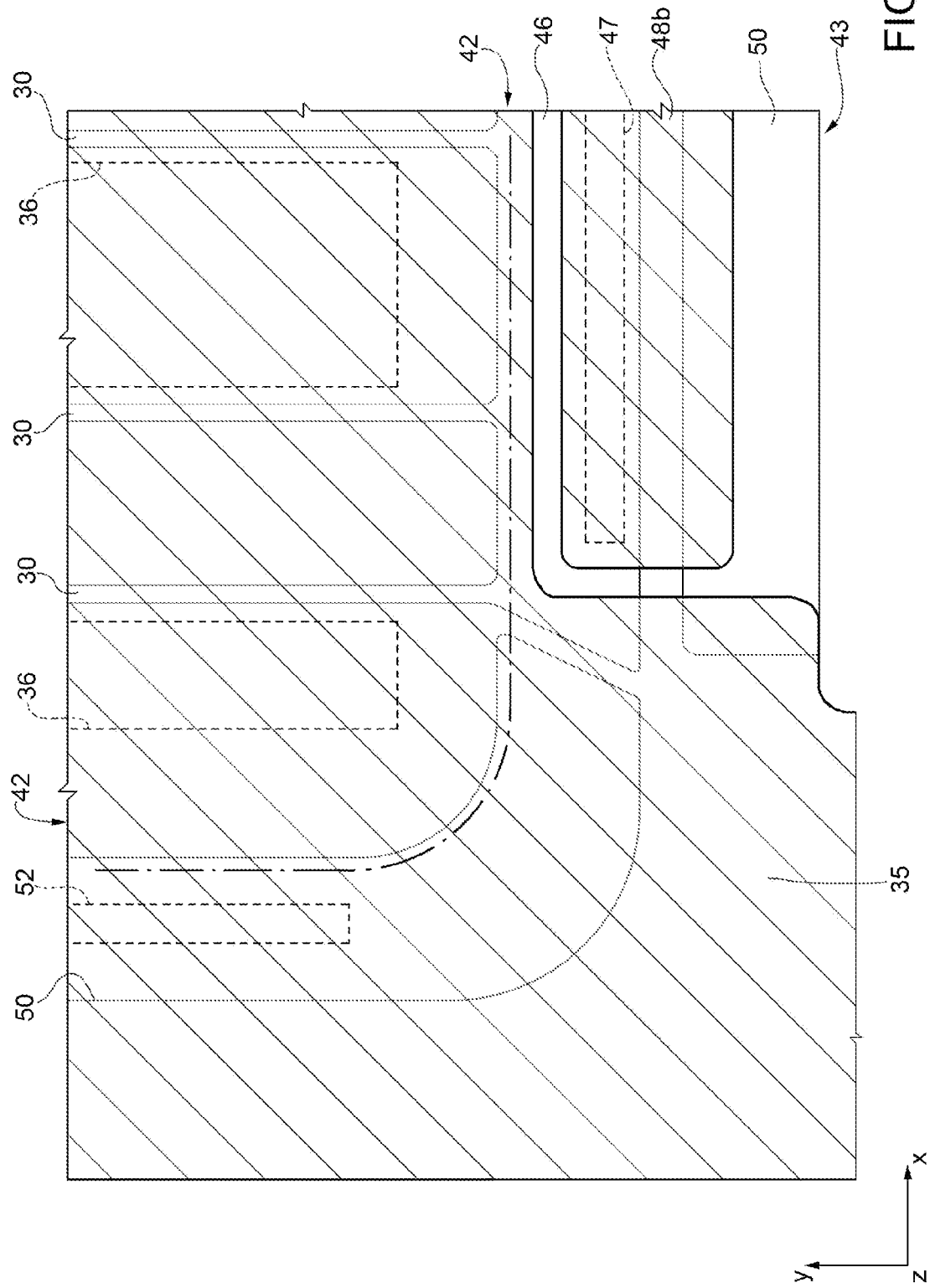
Figure 5E:
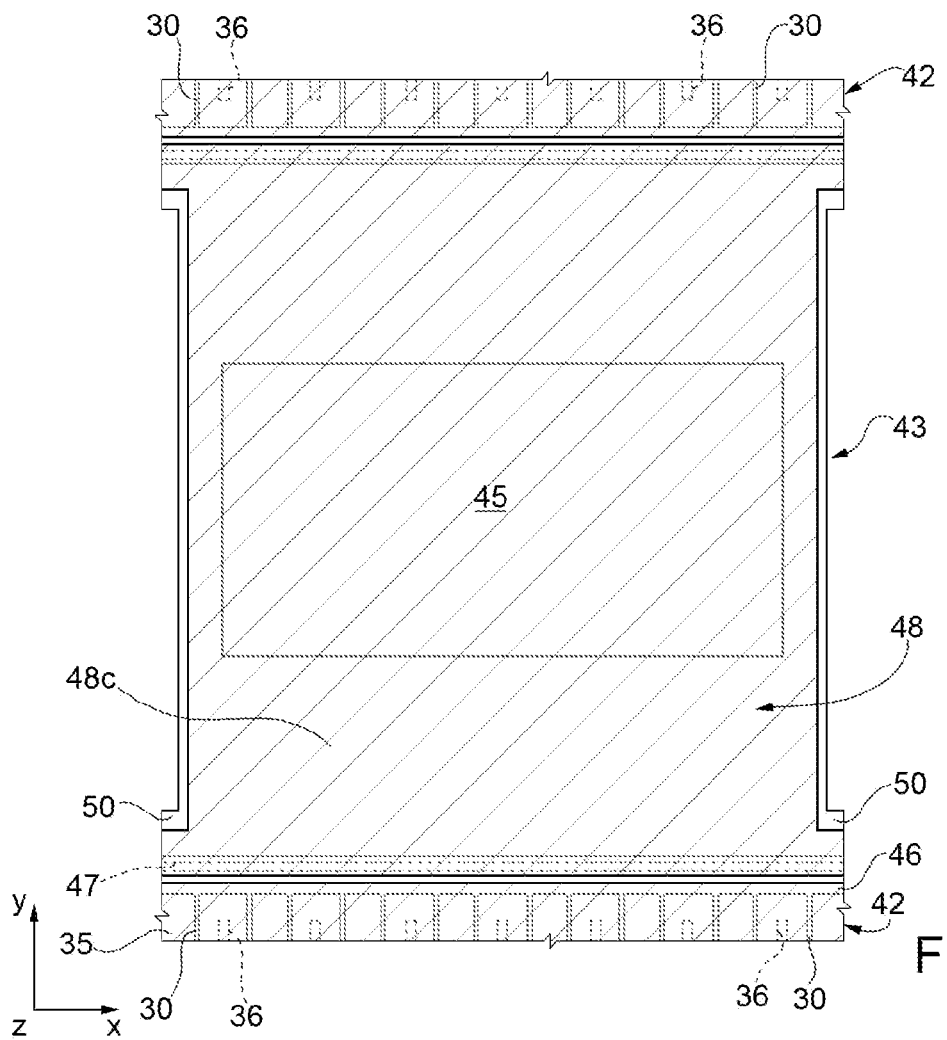

FIGS. 5a-5d show enlarged details of the layout at the top and bottom lateral edges of one of the active areas 42, as indicated in FIG. 4b. FIG. 5e shows, instead, a respective enlarged detail of the layout of the MOS device 20, in a central portion of a non-active area 43, arranged between two adjacent active areas 42.

With reference now to these FIGS. 5a-5d, the layout of the MOS device 20 is illustrated in greater detail.

For each active area 42, two gate buses are present, here designated by 46, each constituted by a conductive region, for example of polysilicon, joined at the bottom, or, respectively, at the top (with respect to the longitudinal direction y), to the gate-electrode regions 30 in areas corresponding to the bottom, or top, edge-termination regions of the active area 42.

The gate buses 46 are contacted, at gate contact regions 47, by a gate-metallization layer 48, which has an as a whole "comb-like" conformation, including: a main portion 48a, extending in the longitudinal direction y, substantially throughout a first longitudinal side of the die 40, alongside the active areas 42; and branch portions 48b, which depart from the main portion 48a, extending in the transverse direction x in regions corresponding to the non-active areas 43, arranging themselves between two adjacent active areas 42, and which contact the gate-electrode regions 30 by the gate contact regions 47.

Basically, the gate-metallization layer 48 consequently surrounds each active area 42 on three sides, at the bottom, at the top and laterally (along one of its sides).

Furthermore, as shown in FIG. 5e, adjacent branch portions 48b are connected together, centrally with respect to the non-active area 43, by connecting portions 48c of the gate-metallization layer 48. Respective gate pads 45 electrically contact these connecting portions 48c.

According to a further aspect of the present solution, an edge-termination shield layer 50 is provided underneath the gate-metallization layer 48; the edge-termination shield layer 50 includes conductive material, for example polysilicon, and has a conformation substantially corresponding to the gate-metallization layer 48 and further includes a plurality of portions, substantially C-shaped, arranged alongside each active area 42, on opposite sides (in the transverse direction x) with respect to the main portion 48a of the same gate-metallization layer 48.

Basically, the edge-termination shield layer 50 entirely surrounds each active area 42, at the bottom, at the top, and laterally on both sides, and is arranged between the functional layer 24 and the gate-metallization layer 48.

In particular, the edge-termination shield layer 50 is provided also underneath the connecting portions 48c of the gate-metallization layer 48, in the non-active area 43, at which the gate pads 45 are defined.

The edge-termination shield layer 50 is set at the same potential as the source of the MOS device 20 (typically a reference potential, for example ground), being in fact electrically contacted by the source-metallization layer 35 through edge-termination shield contact regions 52, which have a longitudinal extension, parallel to the gate and source strips.

As highlighted in FIGS. 5a-5e, the source-metallization layer 35 extends over the entire active area 42, in a laterally more internal position than the gate-metallization layer 48, on a first side of each active area 42, and in a laterally more external position than the same gate-metallization layer 48, on a second side of each active area 42.

Advantageously, the presence of the edge-termination shield layer 50 (arranged between the gate-metallization layer 48 and the functional layer 24) results in a reduction of the effects due to the parasitic capacitances correlated to the layout.

In fact, there occurs a drastic reduction in the capacitance Cgd between gate and drain, linked to the contribution of the gate pads and buses 45, 46, which is split, given the presence of the shield set at the source potential, into two series contributions Cgs (gate-to-source capacitance) and Csd (source-to-drain capacitance), each with a high capacitance (such as to render the parasitic effects substantially negligible).

Figure 6:
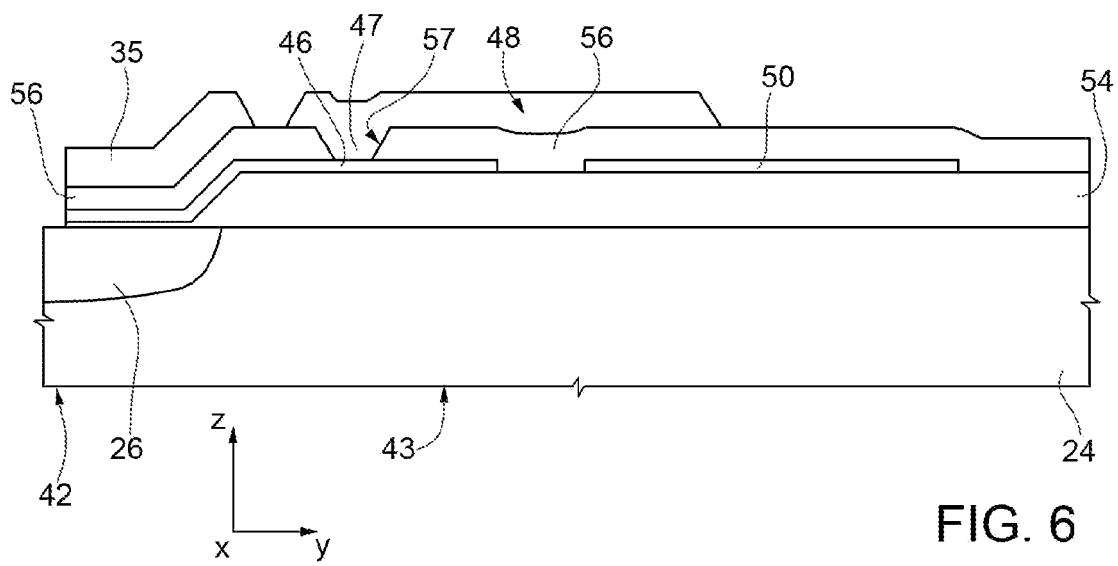
FIG. 6 is a cross-section of an edge-termination portion of the vertical MOS semiconductor device, taken along the line VI-VI of FIG. 5b.

What has been illustrated above will be further understood from FIG. 6, which shows a cross-section in the longitudinal direction y of a portion of the MOS device 20, taken at the edge-termination region of an active area 42 (at which the active area 42 itself borders on a corresponding non-active area 43), as represented by the line of section VI-VI in FIG. 5*b*.

In detail, in the non-active area 43, a field-oxide region 54 is provided above the functional layer 24.

The polysilicon layer of the gate bus 46 is arranged, in the same non-active area 43, over the field-oxide region 54; in addition, also the edge-termination shield layer 50 extends over the field-oxide region 54, in a laterally more external position and separated from the gate bus 46 by an intermediate dielectric region 56.

The intermediate dielectric region 56 further overlies the gate bus 46 and the edge-termination shield layer 50, and has gate contact openings 57, such as to enable electrical contact between the gate-metallization layer 48 (which extends over the aforesaid intermediate dielectric region 56) and the same gate bus 46, through the gate contact region 47.

The source-metallization layer 35, which also extends over the intermediate dielectric region 56, is electrically separated from the gate-metallization layer 48 and arranged in a laterally more internal position with respect thereto.

Yet a different aspect of the present solution is now described, which envisages a further improvement of the electrical performance, by introduction of shielding regions, set at the source potential, also in the active area 42.

Figure 7A:
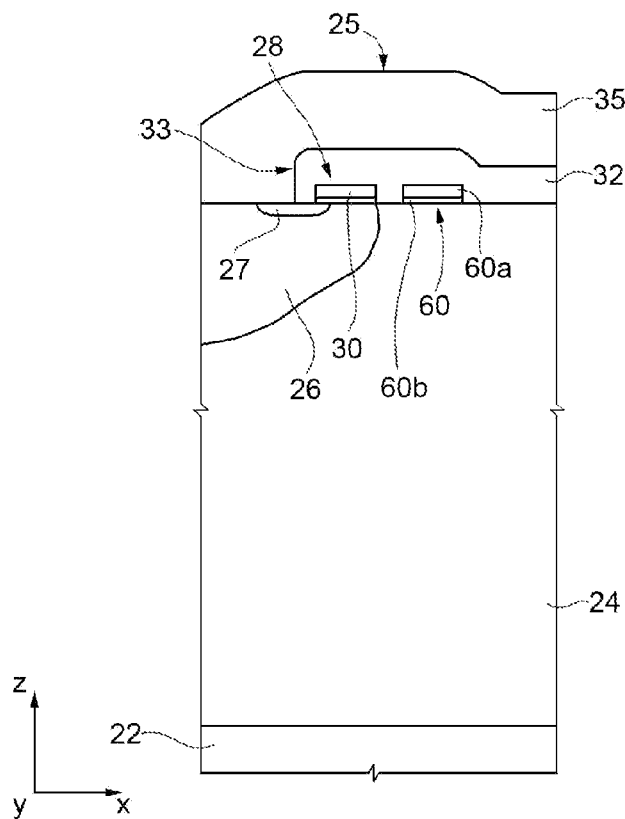
FIGS. 7a-7c show respective cross-sections of a portion of a vertical MOS semiconductor device, according to further embodiments of the present disclosure.

In detail, and with reference first to FIG. 7*a*, MOS device 20 further comprises at least an active-area shield structure 60, set at the source potential and arranged between two adjacent gate-electrode regions 30, above the functional layer 24 (in the area of the drift region comprised between adjacent body wells 26).

The active-area shield structure 60 has a generally strip-like conformation in the longitudinal direction y, parallel to the gate structures 28, and comprises a conductive region 60*a*, for example, made of polysilicon (possibly treated using the silicide process), separated from the functional layer 24 by a dielectric region 60*b*. The dielectric layer 32 coats the shielding structure 60 in the active area, except at a contact region (here not shown) for guaranteeing electrical contact thereof with the overlying source-metallization layer 35.

Advantageously, the active-area shield structure 60 may be obtained with process steps in common with the formation of the gate structure 28 (as will be described in greater detail hereinafter).

In the embodiment shown in FIG. 7*a*, the active-area shield structure 60 is arranged locally in the proximity of a gate structure 28 and of the corresponding body well 26, and has an extension in the transverse direction x comparable to that of the same gate structure 28.

Figure 7B:
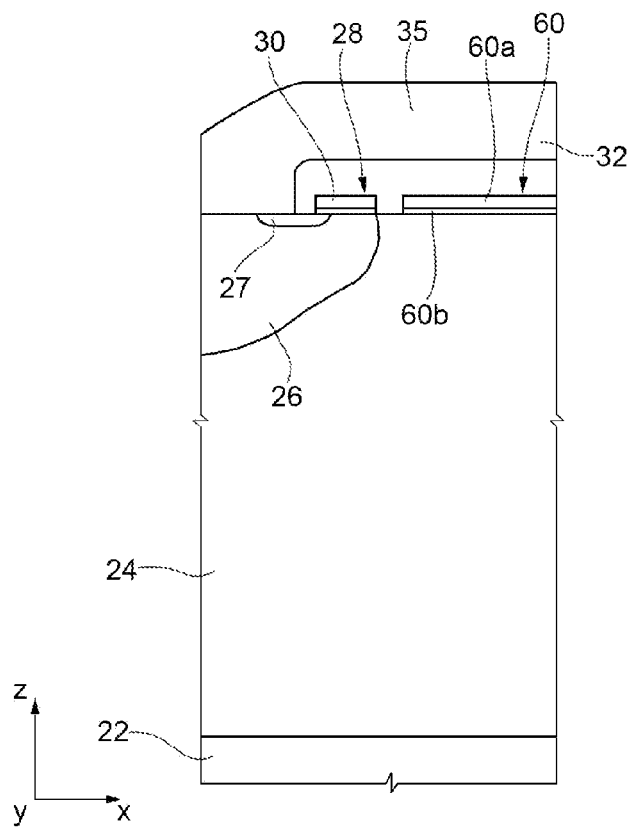

In a different embodiment, illustrated in FIG. 7*b*, the active-area shield structure 60 has a greater transverse extension, for example extending substantially over the entire drift region of the functional layer 24, between adjacent body wells 26.

Figure 7C:
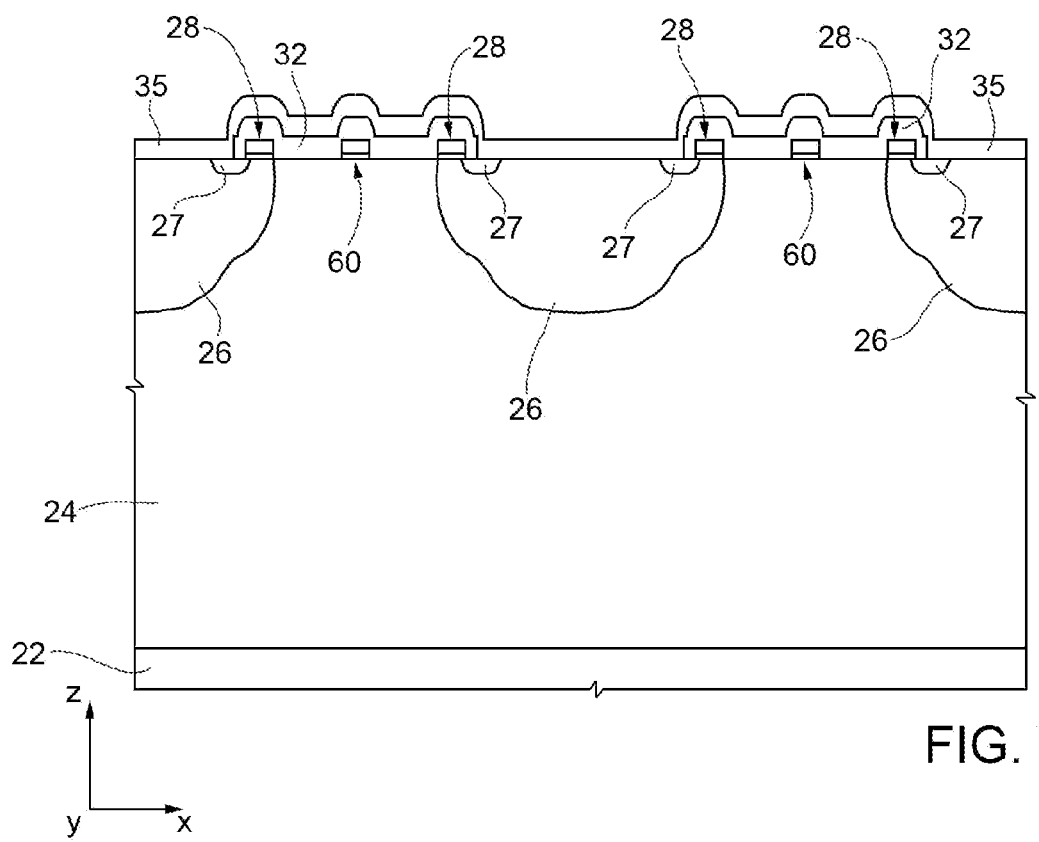

Yet in a different embodiment, illustrated in FIG. 7*c*, the active-area shield structure 60 has once again a transverse extension comparable to that of the gate structure 28, and is arranged centrally with respect to the drift region of the functional layer 24, between adjacent body wells 26 (in particular, FIG. 7*c* illustrates a wider portion in a transverse direction x of the MOS device 20, which includes three body wells 26, adjacent to one another in pairs).

Figure 8:
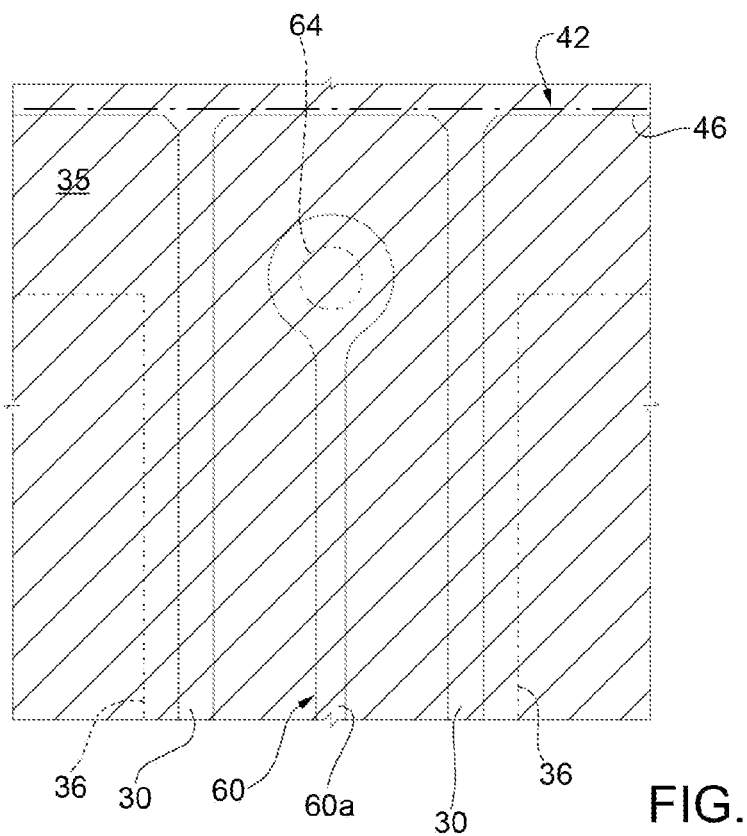
FIG. 8 is a schematic top plan view of a portion of the layout of the vertical MOS semiconductor device of FIG. 7c.

As illustrated in FIG. 8, which shows, by way of example, the layout of a portion of the MOS device 20 in the embodiment of FIG. 7*c*, shield contact openings are provided through the dielectric layer 32, in the proximity of the edge-termination region of the active area 42 (and of the respective gate bus 46), which are filled by shield contact regions 64 connected to the source-metallization layer 35. In particular, the conductive region 60*a* of the active-area shield structure 60 has a widened shape, at the aforesaid shield contact region 64, that is, for example, circular in top plan view, for ensuring a greater contact area for the same shield contact regions 64.

In a way not illustrated, further shielding structures may be provided in the active area, between one or more pairs of adjacent gate structures 28, in an overall number equal to or greater than two.

In any case, the presence of the shield at the source potential (for example, set at ground) results, as regards the active area 42, in an immediate improvement of the breakdown voltage of the MOS semiconductor device 20, thanks to an improved control of the electrical potential lines.

In particular, the solution described with reference to FIG. 7*a* determines an advantageous effect on the so-called "fringing" capacitance, but may worsen the "accumulation" component of the resistance RDSon.

The use of the solution of FIG. 7*b* makes it possible to improve control of the field lines, but may have an adverse effect in the increase of the output capacitance, with a non-negligible impact on the final frequency performance (in particular, at high frequencies).

The solution described in FIG. 7*c* may, at least in given conditions, represent an improved solution that is a compromise between the characteristics of the solutions of FIGS. 7*a* and 7*b*.

In any case, an appropriate sizing and an appropriate design of the shielding structure, whether single or multiple, in the active area (as regards, for example, the number and positioning of the active-area shields 60) may allow to achieve an optimal compromise that will enable an uniform distribution of the field lines in the drain region, and a consequent increase in the breakdown voltage in the active area 42, without feeling the adverse effects highlighted above.

The present Applicant has verified, by numeric tests and simulations, the possibility of reaching breakdown voltages with values comparable to, if not higher than, those of standard devices of a known type.

Figure 9A:
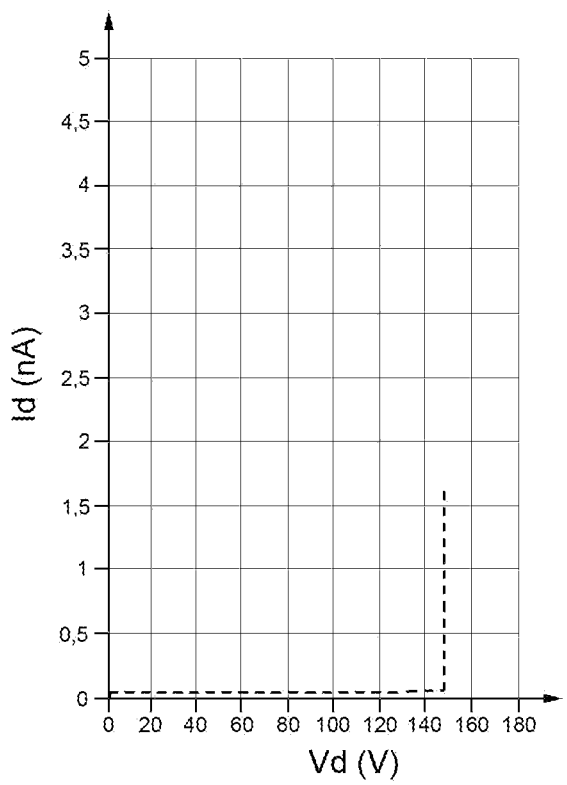
FIGS. 9a-9b and 10a-10b show plots of electrical quantities related to the vertical MOS semiconductor device.
Figure 9B:
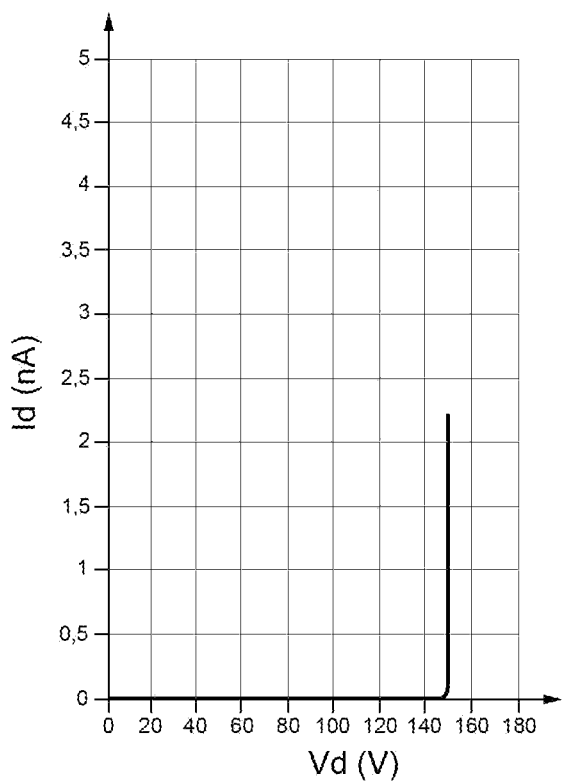

In this regard, FIGS. 9*a* and 9*b* show the breakdown characteristic of a MOS device 20 according to the present solution (FIG. 9*b*) as compared with that of a standard device (FIG. 9*a*), from which the comparable values for the breakdown voltage BVDss may be noted.

The features described above are such that the semiconductor device 20 according to the present solution has generally improved electrical characteristics at high operating frequencies, for example at radiofrequency.

Figure 10A:
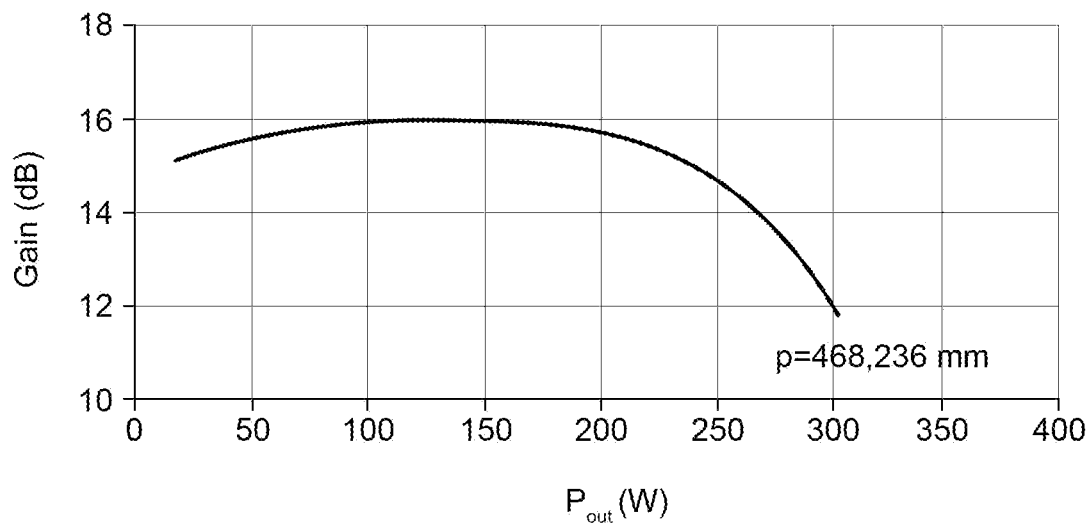
Figure 10B:
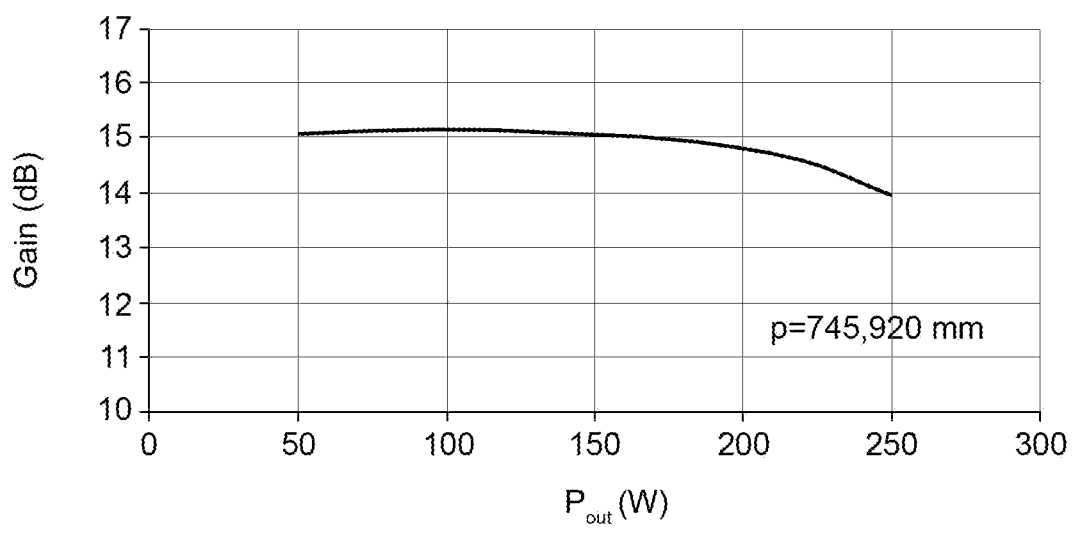

In this regard, FIGS. 10*a* and 10*b* show the output gain characteristic (in dB) vs. the output power (Pout), for the MOS device 20 (FIG. 10*a*), as compared to that of a standard device (FIG. 10b); given the same operating frequency (in this case 175 MHz), the improved gain value and the increased range of use, as regards the values of output power, may be noted. Further to be emphasized is the fact that the semiconductor device 20 has a channel perimeter P considerably smaller than that of a standard device.

A further embodiment of the MOS device 20 is now disclosed, which may enable further improvement of the control of the electrical characteristics in the active area 42.

Figure 11A:
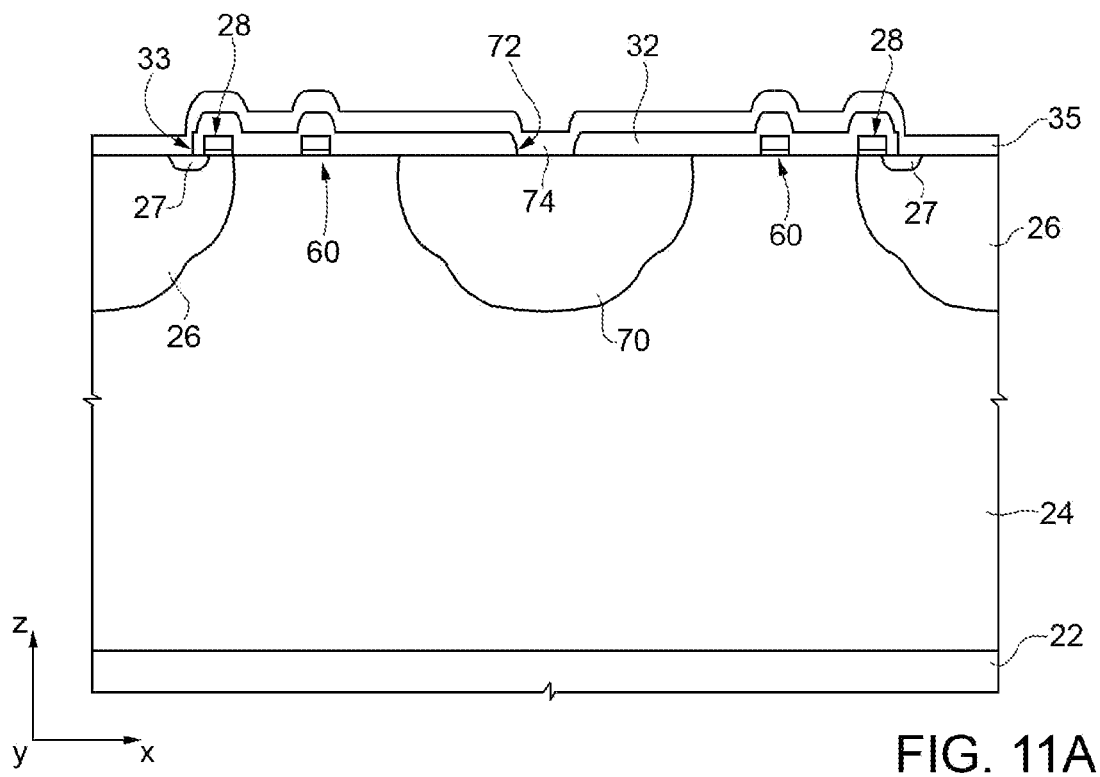
FIGS. 11a and 11b show respective cross-sections of a portion of a vertical MOS semiconductor device, according to further embodiments of the present disclosure.
Figure 11B:
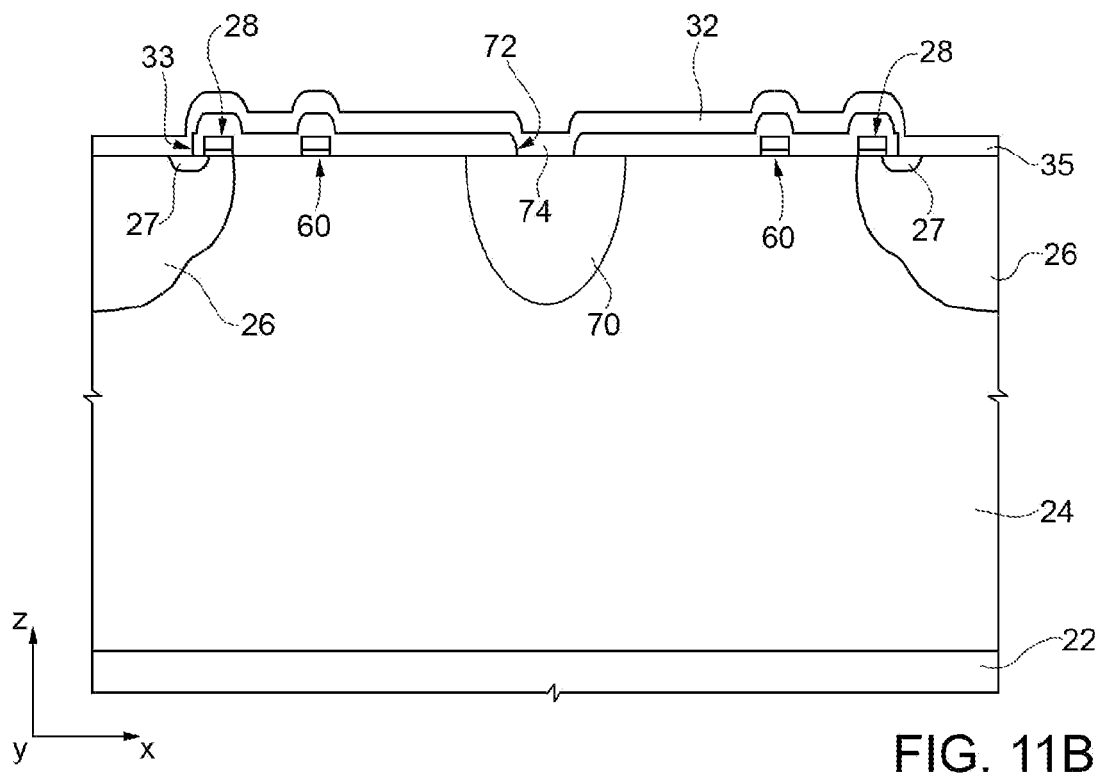

In detail, and with reference to FIGS. 11a, 11b, MOS device 20 envisages in this case further doped regions having the same conductivity as the body wells 26, in the example a $P^+$ conductivity, each one arranged between two adjacent body wells 26.

Even though these doped regions are arranged in the active area 42, they do not take part in the active operation of the MOS semiconductor device 20, but, amongst other things, they take part in control of the lines of electrical field in the active area 42, and are consequently defined as "control doped regions 70".

For the above purpose, the control doped regions 70 are set at the source potential. The overlying dielectric layer 32 thus has control contact openings 72, at respective central portions of the control doped regions 70, inside which control contact regions 74 of the source-metallization layer 35 are present.

In the embodiment illustrated in FIG. 11a, the control doped regions 70 comprise respective implanted and diffused wells altogether equivalent to the body wells 26 (apart from the fact that they are functionally non-active, i.e., they do not provide a contribution to the current of the MOS device 20), having similar and corresponding dimensions and characteristics.

In the embodiment illustrated in FIG. 11b, the control doped regions 70 include, instead, doped regions with smaller transverse dimensions than the body wells 26, arranged centrally with respect to the region of the functional layer 24 between adjacent body wells 26.

In general, this further solution is advantageous when the distance between adjacent body wells 26 is large, for example in the case where a reduction in the number of active strips in the active area 42 is required (for example, for an optimization of the output power), in order to contribute to ensuring a control of the lines of electrical field, i.e., preventing a loss of efficiency as regards breakdown in the active area.

This solution further enables management and control of the overall electric power, and in any case allows a wide extension of the die, for improving outwards heat distribution.

There now follows a description (as regards its salient steps) of the process for manufacturing the MOS device 20, with reference, purely by way of example, to the embodiment shown in FIG. 11a.

Figure 12A:
FIGS. 12a-12r show sections of a portion of the vertical MOS semiconductor device, in successive steps of a manufacturing process according to an embodiment of the present disclosure.

As illustrated in FIG. 12a, the functional layer 24 is first grown, with the epitaxial technique, on the structural layer 22, the functional layer 24 having the same type of conductivity and a lower concentration of dopants.

Figure 12B:

Then (FIG. 12b), a growth of field oxide is carried out over the entire wafer for forming a field-oxide layer 80 above the functional layer 24.

Figure 12C:
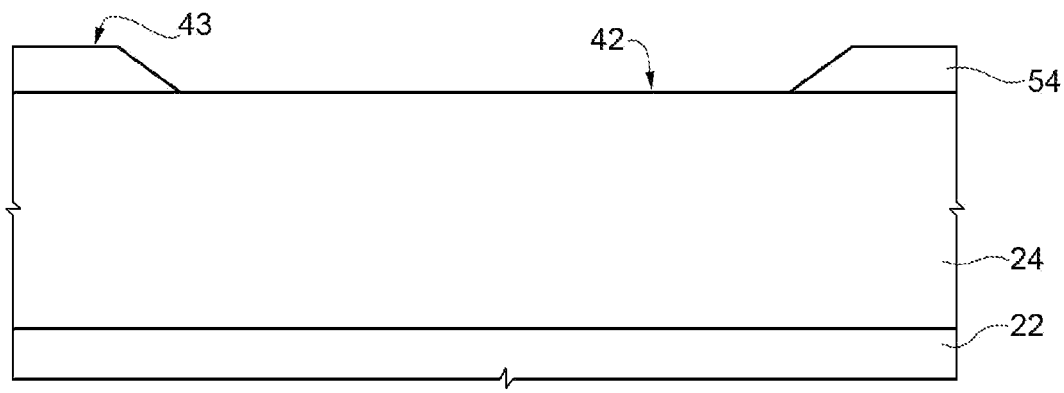

The field-oxide layer 80 is then subjected to photolithographic etching (FIG. 12c), for definition of the field-oxide region 54 in the non-active area 43 and removal of the field-oxide layer 80 in the active area 42.

Figure 12D:
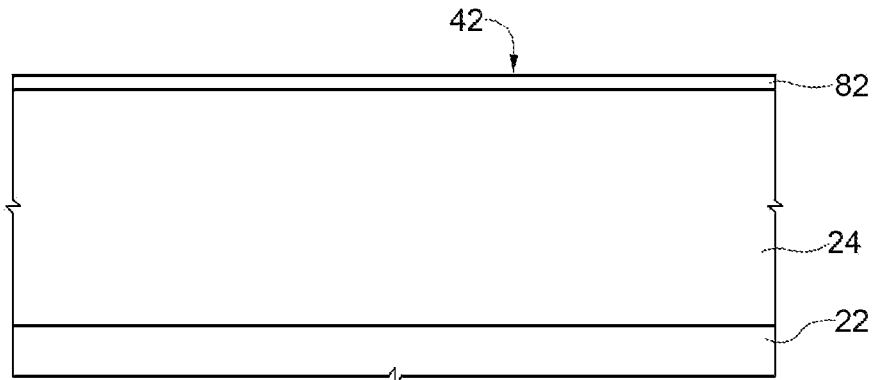

As shown in FIG. 12d (which, as the subsequent figures, refers to the sole active area 42), a gate-oxide layer 82 is then grown in the active area 42.

Figure 12E:
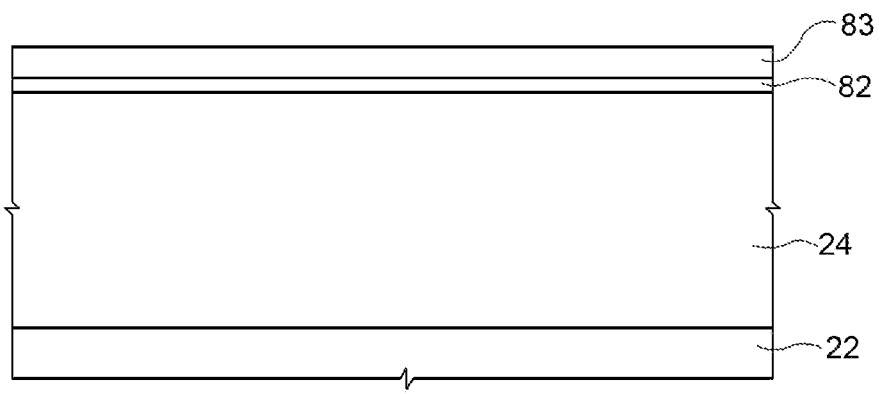
Figure 12F:
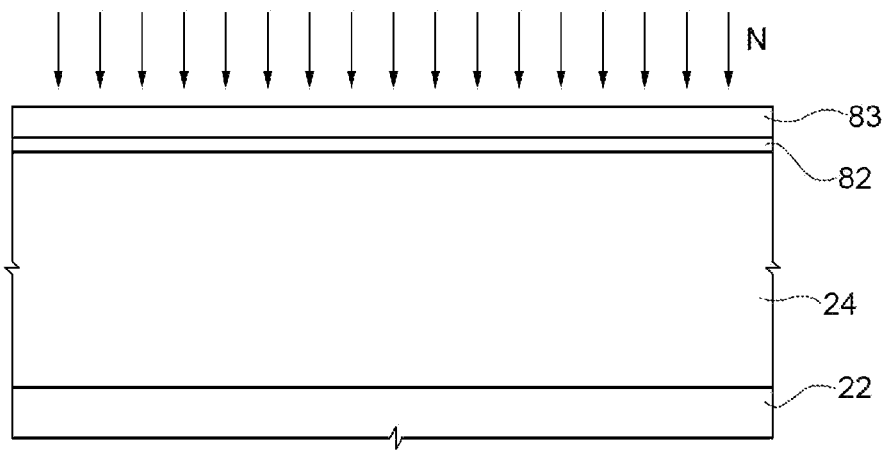
Figure 12G:
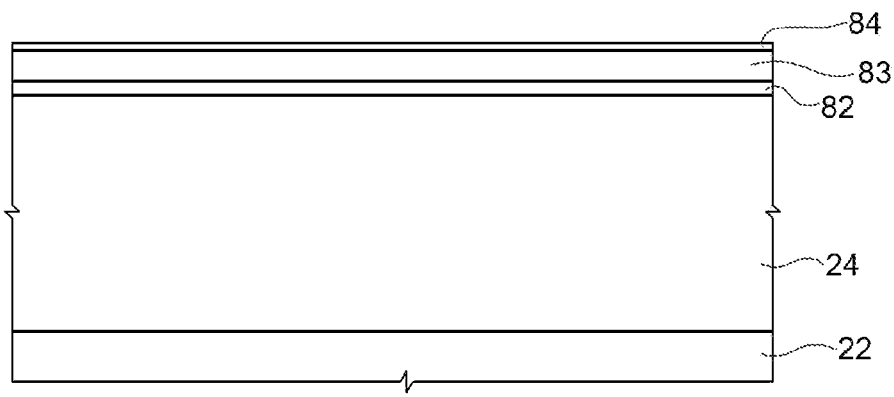

Next (FIG. 12e), a polysilicon layer 83 is deposited on the gate-oxide layer 82, and is then subjected to N-type doping (FIG. 12f), for example with phosphorus atoms. Next, a nitride layer 84 is deposited on the polysilicon layer 83 (FIG. 12g).

Figure 12H:
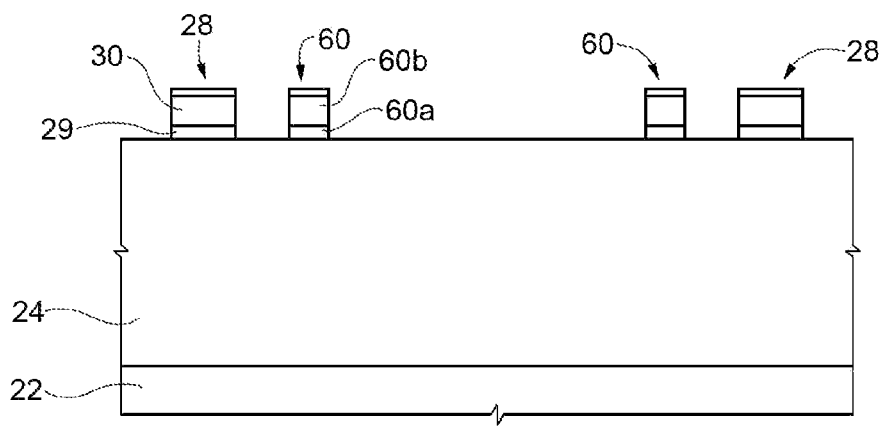

As shown in FIG. 12h, via a step of photolithographic etching, through appropriate masking, the gate structures 28 are defined, comprising a respective gate dielectric region 29, defined starting from the gate-oxide layer 82, and a respective gate-electrode region 30, defined starting from the polysilicon layer 83.

By photolithographic etching (advantageously, in the same process steps), the active-area shields 60 are further defined, including a respective conductive region 60a, defined starting from the polysilicon layer 83, overlying a respective dielectric region 60b, defined starting from the gate-oxide layer 82.

Figure 12I:
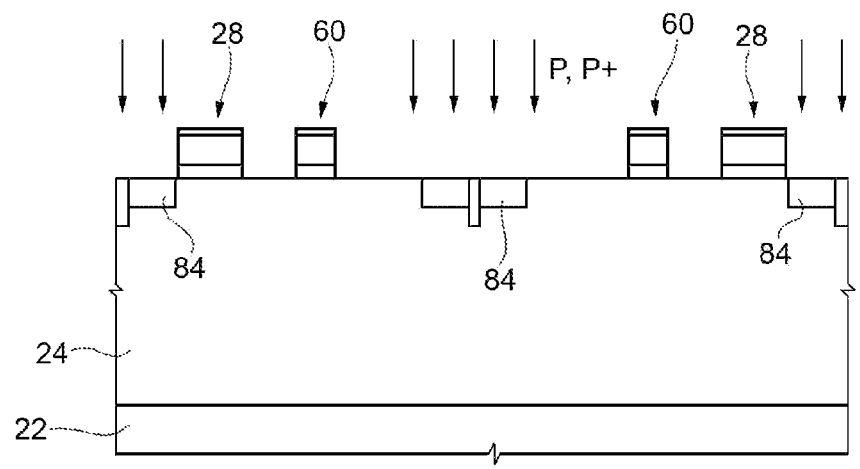
Figure 12L:
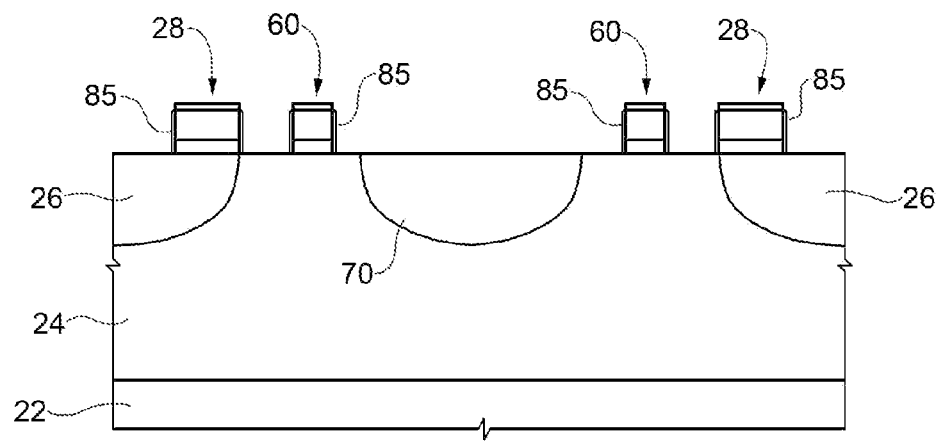

In a subsequent process step, illustrated in FIG. 12i, appropriate implants are carried out (in particular, a deep implant of a $P^+$ type and a surface implant of a P type), through an appropriate mask to obtain doped regions 84, which, with subsequent diffusion (FIG. 12l), leads to the definition of the body wells 26.

In particular, the diffusion parameters (for example, in terms of duration and temperature) are such that, at the end of the corresponding process step, the gate-electrode region 30 has side walls vertically aligned to the boundary of the underlying body well 26. It should be noted that, in a way not described in detail, on the aforesaid side walls spacers 85 of dielectric material may be present, for example due to oxidation processes during the diffusion steps.

Via the same process steps, of implantation and diffusion, the doped control regions 70 are further provided, in the portion of the functional layer 24 arranged between adjacent body wells 26, which, in this embodiment, have a conformation altogether similar to that of the same body wells 26.

Figure 12M:
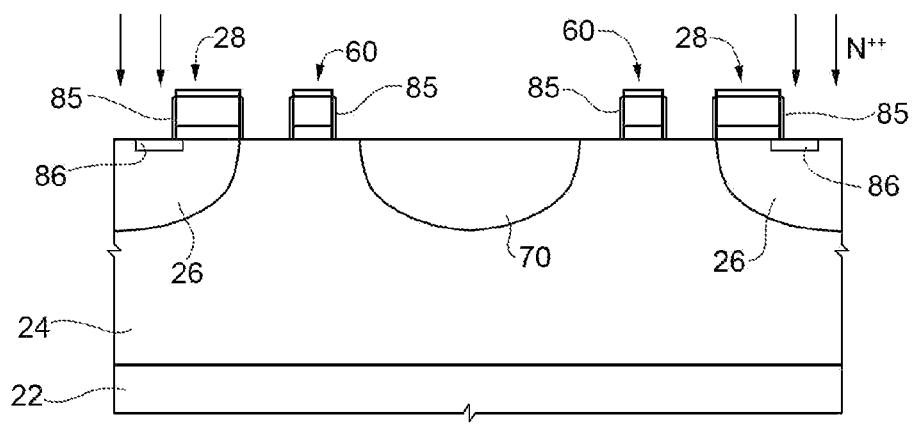

The process proceeds (FIG. 12m) with a new masking and implantation, for example of an $N^{++}$ type with phosphorus atoms, to obtain corresponding doped regions 86 within the body wells 26.

Figure 12N:
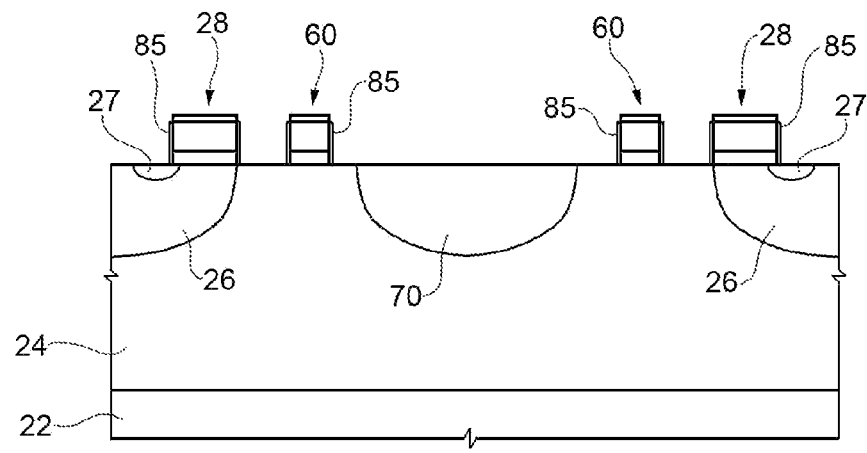

These doped regions are then subjected (FIG. 12n) to a diffusion step for defining source regions 27, which extend in part laterally underneath the gate structures 28.

Figure 12O:
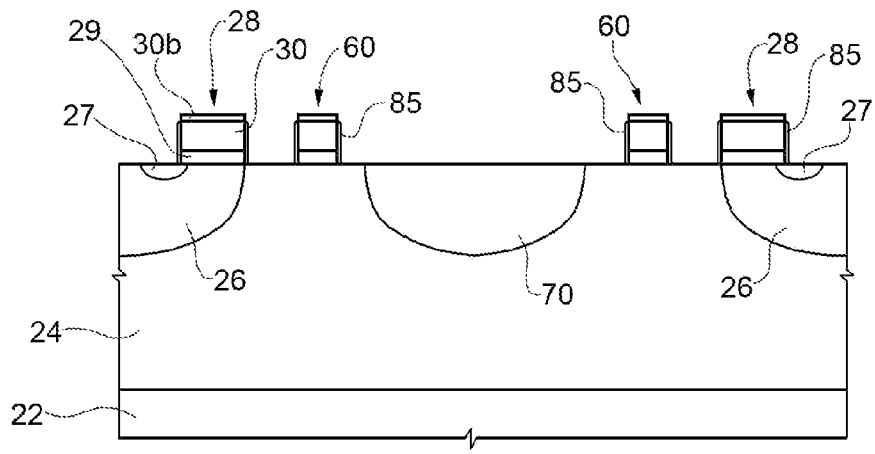

Next (FIG. 12o), in a per se known manner, not described in detail herein, portions of the nitride layer 84 are removed in areas corresponding to the gate structures 28, and the silicide regions 30b are formed on the gate-electrode regions 30 and possibly the conductive regions 60a of the active-area shields 60.

Figure 12P:
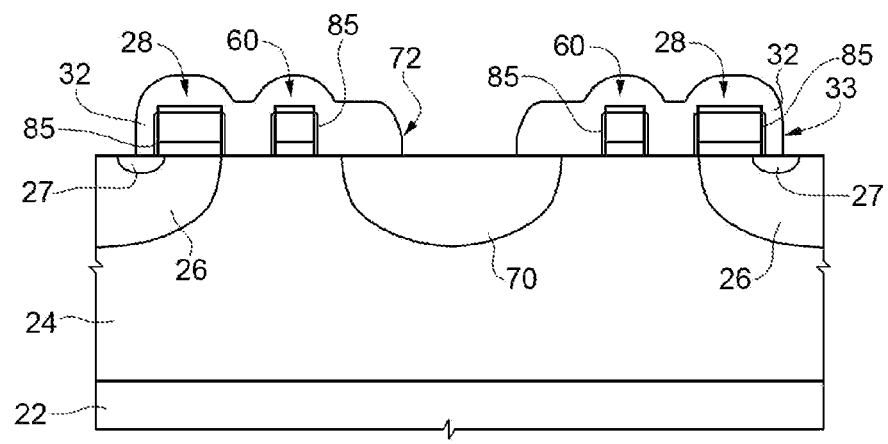

The process proceeds (FIG. 12p) with deposition of the dielectric layer 32 and definition of the source contact openings 33 and of the control contact openings 72 through the dielectric layer 32.

Figure 12Q:
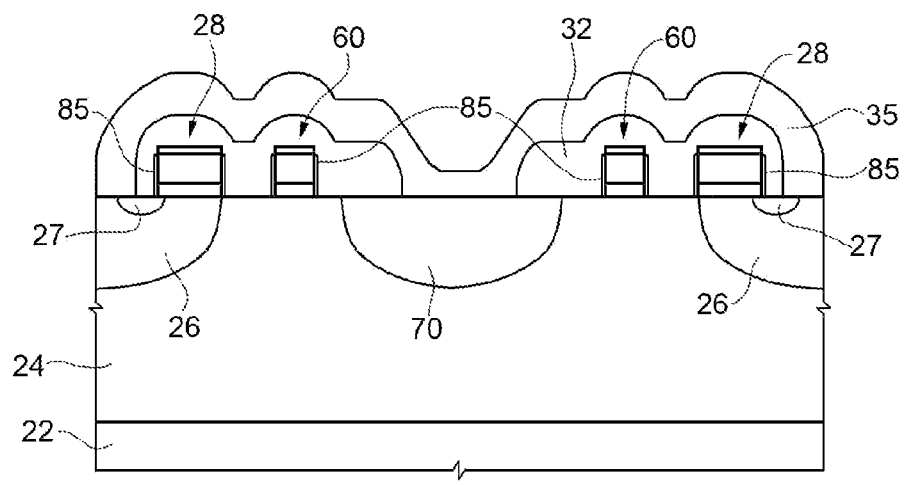
Figure 12R:
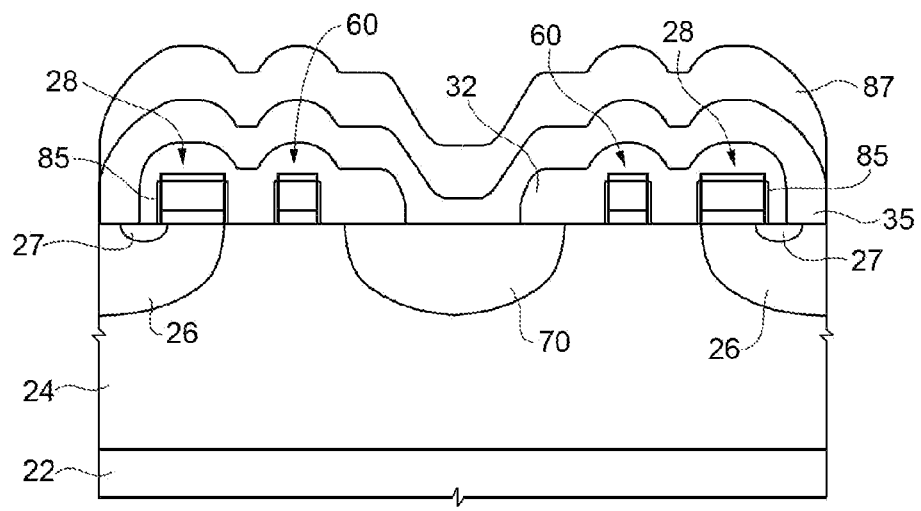

A metallization step is then carried out on the wafer, in particular to provide the source-metallization layer 35 (FIG. 12q), over which a dielectric passivation layer 87 is next deposited (FIG. 12r).

From what has been described so far, the advantages that the MOS semiconductor device according to the present solution affords emerge clearly.

In general, it is once again emphasized that MOS device 20 enables the limitations associated to standard devices for high-frequency applications, for example radiofrequency, to be overcome.

MOS device 20 has in fact improved electrical characteristics in terms of supplied current, electric power, gain, and the possibility of working at high frequencies maintaining good performance levels and a low risk of breakdown.

Furthermore, MOS device 20 enables a general reduction of the dimensions in the integrated implementation, as compared to standard devices.

The process for manufacturing the MOS device 20 does not present critical aspects and envisages the use of process techniques in themselves consolidated in the semiconductor industry.

Finally, it is clear that modifications and variations may be made to what has been described and illustrated herein, without thereby departing from the scope of the present disclosure.

In particular, what has been described with reference to the edge-termination structures and the non-active area 43 of the MOS device 20 clearly applies also to the case where the MOS device 20 is provided with the active-area shield structures 60 and/or the control doped regions 70, even though the description of the edge-termination and non-active areas themselves has not in this case been repeated in order not to burden the exposition. It is, on the other hand, evident that the combination of one or more of the solutions described previously may enable, in a synergistic way, improvement of the performance of the MOS device 20, in particular at high operating frequencies.

Furthermore, the number and conformation of the shielding structures in the active area 42 and in the non-active area 43 may differ from what has been illustrated, by way of example.

It is evident that the conductivities of the layers and of the regions in the MOS device 20 may be reversed with respect to what has been previously described; for example, even though the entire description refers to the case of an N-channel MOS device, the extension to the dual case of a P-channel MOS device is immediate.

In addition, it is equally evident that the solution described may find advantageous application in a generic MOS semiconductor device of a vertical type, in particular for applications at high operating frequency, for example in signal or power VDMOS devices, IGBTs, IP (Intelligent Power) MOSFETs, for example for automotive applications, N-channel or P-channel MOSFETs in general, with edge terminations of any shape and size.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MOS semiconductor device, of a vertical type, comprising:
a functional layer, which has a first type of conductivity and is configured to provide a first current-conduction region of said device;
first and second gate structures positioned above said functional layer, each gate structure including a dielectric region and an electrode region;
first and second body wells, which have a second type of conductivity, are formed within said functional layer, and are separated from one another by a surface separation region of said functional layer;
first and second source regions, which have said first type of conductivity, are formed respectively within said first and second body wells, are positioned laterally and partially underneath the first and second gate structures, respectively, and are configured to provide a second current-conduction region of said device, wherein the first and second gate structures extend directly above the first and second body wells, respectively and do not overlap the surface separation region of said functional layer;
a first shield structure, arranged at an active area between the first and second gate structures and above the surface separation region of said functional layer; wherein said first shield structure includes a first conductive region configured to be set at a same potential as said source regions;
a dielectric layer covering the first and second gate structures and the first shield structure;
a first shield contact region positioned in a first hole in the dielectric layer; and
a source-metallization layer electrically connected to the conductive region of the first shield structure through the first shield contact region and electrically connected to the first and second source regions.

2. The device according to claim 1, wherein:
said first body well has a first separation boundary with said surface separation region of said functional layer,
said second body well has a second separation boundary with said surface separation region of said functional layer,
said first gate structure comprises a first electrode region having a first side wall arranged vertically at said first separation boundary, and
said second gate structure comprises a second electrode region having a first side wall arranged vertically at said second separation boundary.

3. The device according to claim 2, wherein:
said first electrode region has a second side wall, opposite to the first side wall of the first electrode region, arranged vertically at the first source region,
said first electrode region has a lateral extension limited between said first source region and said first separation boundary, at a channel region of said device.

4. The device according to claim 2, wherein each electrode region comprises a respective high-conductivity surface portion.

5. The device according to claim 1, wherein said first shield structure is arranged closer to said first gate structure than to the second gate structure.

6. The device according to claim 1, wherein said first shield structure extends substantially above the entire surface separation region of said functional layer between adjacent body wells.

7. The device according to claim 1, wherein said first shield structure is arranged centrally with respect to the surface separation region of said functional layer, between the first and second body wells.

8. The device according to claim 1, comprising:
a second shield structure, arranged at said active area between the first and second gate structures above the surface separation region of said functional layer; wherein said second shield structure includes a second conductive region configured to be set at the same potential as said source regions, wherein the second shield structure is covered by the dielectric layer; and a second shield contact region positioned in a second hole of the dielectric layer and electrically coupling the source-metallization layer to the second conductive region.

9. The device according to claim 1, wherein said gate structures and said first shield structure extend in a strip-like manner, parallel to one another, above said functional layer at said active area.

10. The device according to claim 1, further comprising:
a control doped region, having the second type of conductivity, arranged within said surface separation region of said functional layer, between adjacent body wells, the control doped region being configured to be set at a same potential as said source regions; and
a control contact region electrically coupling the control doped region to the source-metallization layer.

11. The device according to claim 10, wherein said control doped region has a conformation corresponding to said body wells.

12. The device according to claim 1, wherein:
said functional layer comprises:
a first active area, arranged in which are said gate structures, said body wells, and said source regions; and
a non-active area, distinct from, and bordering on, said first active area at an edge-termination region thereof;
the source-metallization layer extends above said functional layer at said active area, and is in contact with said source regions and with said body wells,
the dielectric layer separates the source-metallization from said gate structures; and
the device further comprises source contact pads, coupled to said source-metallization layer at said active area, and configured to electrically couple said second current-conduction region externally of said device.

13. The device according to claim 12, comprising:
a gate bus electrically coupled to the electrode regions of each of said gate structures at said edge-termination region of said active area;
a gate-metallization layer extending above said functional layer at said non-active area, and in contact with said gate bus at said edge-termination region;
a gate contact pad coupled to said gate-metallization layer at said non-active area, for electrical connection from outside to said electrode regions of said gate structures;
an edge-termination shield layer, including conductive material, arranged between said gate-metallization layer and said functional layer at said non-active area, and surrounding said active area; said edge-termination shield layer being configured to be set at the same potential as said source regions; and
edge-termination shield contact regions positioned at said edge-termination region of said active area and electrically coupling the edge-termination shield layer to the source-metallization layer.

14. The device according to claim 13, wherein said functional layer comprises a second active area, adjacent to said first active area, and said non-active area is arranged between the first and second active areas; wherein said gate contact pad, arranged at said non-active area, is configured for electrical connection externally to the electrode regions of the gate structures, which are arranged at both of the first and second active areas.

15. The device according to claim 10, wherein the source-metallization layer is positioned in a hole in the dielectric layer.

16. A process, comprising:
manufacturing a MOS semiconductor device of a vertical type, the manufacturing including:
providing a functional layer, which has a first type of conductivity and is configured to provide a first current-conduction region of said device;
forming first and second gate structures above said functional layer, each gate structure including a region of dielectric material and an electrode region;
forming first and second body wells, which have a second type of conductivity, within said functional layer, and are separated from one another by a surface separation region of said functional layer;
forming first and second source regions, which have said first type of conductivity, respectively within said first and second body wells, are positioned laterally and partially underneath respective gate structures, and are configured to provide a second current-conduction region of said device, wherein forming the first and second gate structures comprises forming the first and second gate structures extending directly above the first and second body wells, respectively, and not overlapping the surface separation region of said functional layer;
forming a shield structure arranged between the first and second gate structures and above the surface separation region of said functional layer, the shield structure including a conductive region configured to be set at a same potential as said source regions, wherein forming said first and second gate structures and forming said shield structure are carried out with process steps in common;
forming a dielectric layer covering the first and second gate structures and the shield structure;
forming a shield contact region positioned in a hole in the dielectric layer; and
forming a source-metallization layer electrically connected to the conductive region of the shield structure through the shield contact region and electrically connected to the first and second source regions.

17. The process according to claim 16, comprising forming a doped control region, having the second type of conductivity, arranged within said surface separation region of said functional layer, the doped control region being configured to be set at a same potential as said source regions; wherein forming said first and second body wells and forming said doped control region are carried out with process steps in common.

18. The process according to claim 17, comprising:
forming a dielectric layer covering the first and second gate structures and the doped control region;
forming a control contact region positioned in a hole in the dielectric layer; and
forming a source-metallization layer electrically connected to the doped control region through the control contact region and electrically connected to the first and second source regions.

19. A MOS semiconductor device, of a vertical type, comprising:
a functional layer, which has a first type of conductivity and is configured to provide a first current-conduction region of said device;
first and second gate structures positioned above said functional layer, each gate structure including a dielectric region and an electrode region;
first and second body wells, which have a second type of conductivity, are formed within said functional layer, and are separated from one another by a surface separation region of said functional layer; and first and second source regions, which have said first type of conductivity, are formed respectively within said first and second body wells, are positioned laterally and partially underneath the first and second gate structures, respectively, and are configured to provide a second current-conduction region of said device, wherein:

the first and second gate structures extend directly above the first and second body wells, respectively and do not overlap the surface separation region of said functional layer; and said functional layer comprises:
a first active area, arranged in which are said gate structures, said body wells, and said source regions; and
a non-active area, distinct from, and bordering on, said first active area at an edge-termination region of the first active region;

a source-metallization layer extending above said functional layer at said active area, and in contact with said source regions and with said body wells;

an edge-termination shield layer, including conductive material and surrounding said first active area; said edge-termination shield layer being configured to be set at the same potential as said source regions; and edge-termination shield contact regions positioned at said edge-termination region of said active area and electrically coupling the edge-termination shield layer to the source-metallization layer.

20. The device according to claim 19, wherein said functional layer comprises a dielectric layer that separates the source-metallization from said gate structures, the device further comprising:

source contact pads coupled to said source-metallization layer at said active area and configured to electrically couple said second current-conduction region externally of said device;

a gate bus electrically coupled to the electrode regions of each of said gate structures at said edge-termination region of said active area;

a gate-metallization layer extending above said functional layer at said non-active area, and in contact with said gate bus at said edge-termination region; and a gate contact pad coupled to said gate-metallization layer at said non-active area, for electrical connection from outside to said electrode regions of said gate structures.

21. The device according to claim 19, wherein said functional layer comprises a second active area, adjacent to said first active area, and said non-active area is arranged between the first and second active areas; wherein said gate contact pad, arranged at said non-active area, is configured for electrical connection externally to the electrode regions of the gate structures, which are arranged at both of the first and second active areas.

* * * * *